(12) United States Patent
Kwon et al.

(10) Patent No.: US 9,515,022 B2
(45) Date of Patent: Dec. 6, 2016

(54) SEMICONDUCTOR DEVICE WITH AIR GAP AND METHOD FOR FABRICATING THE SAME

(71) Applicant: SK hynix Inc., Gyeonggi-do (KR)

(72) Inventors: Se-Han Kwon, Gyeonggi-do (KR); Ill-Hee Joe, Gyeonggi-do (KR); Dae-Sik Park, Gyeonggi-do (KR); Hwa-Chul Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/170,345

(22) Filed: Jun. 1, 2016

(65) Prior Publication Data

US 2016/0276273 A1    Sep. 22, 2016

Related U.S. Application Data

(63) Continuation of application No. 14/738,421, filed on Jun. 12, 2015, now Pat. No. 9,379,004.

(30) Foreign Application Priority Data

Dec. 18, 2014  (KR) ........................ 10-2014-0183484

(51) Int. Cl.
*H01L 27/088* (2006.01)
*H01L 23/528* (2006.01)
*H01L 29/06* (2006.01)
*H01L 21/764* (2006.01)
*H01L 27/105* (2006.01)
*H01L 21/768* (2006.01)

(52) U.S. Cl.
CPC ......... *H01L 23/5283* (2013.01); *H01L 21/764* (2013.01); *H01L 27/1052* (2013.01); *H01L 29/0649* (2013.01); *H01L 21/7682* (2013.01)

(58) Field of Classification Search
None
See application file for complete search history.

(56) References Cited

U.S. PATENT DOCUMENTS

| 2014/0327063 | A1* | 11/2014 | Park | H01L 27/10814 257/296 |
| 2015/0126013 | A1* | 5/2015 | Hwang | H01L 27/10888 438/381 |
| 2016/0027727 | A1* | 1/2016 | Kim | H01L 23/528 257/774 |

* cited by examiner

*Primary Examiner* — Angel Roman
(74) *Attorney, Agent, or Firm* — IP & T Group LLP

(57) ABSTRACT

A method for fabricating a semiconductor device includes preparing a substrate which includes a memory cell region and a peripheral circuit region; forming a buried word line in the substrate in the memory cell region; forming a planar gate structure over the substrate in the peripheral circuit region; forming a bit line structure over the substrate in the memory cell region; forming a first air spacers over a sidewalls of the planar gate structure; and forming a second air spacers over a sidewalls of the bit line structure.

5 Claims, 31 Drawing Sheets

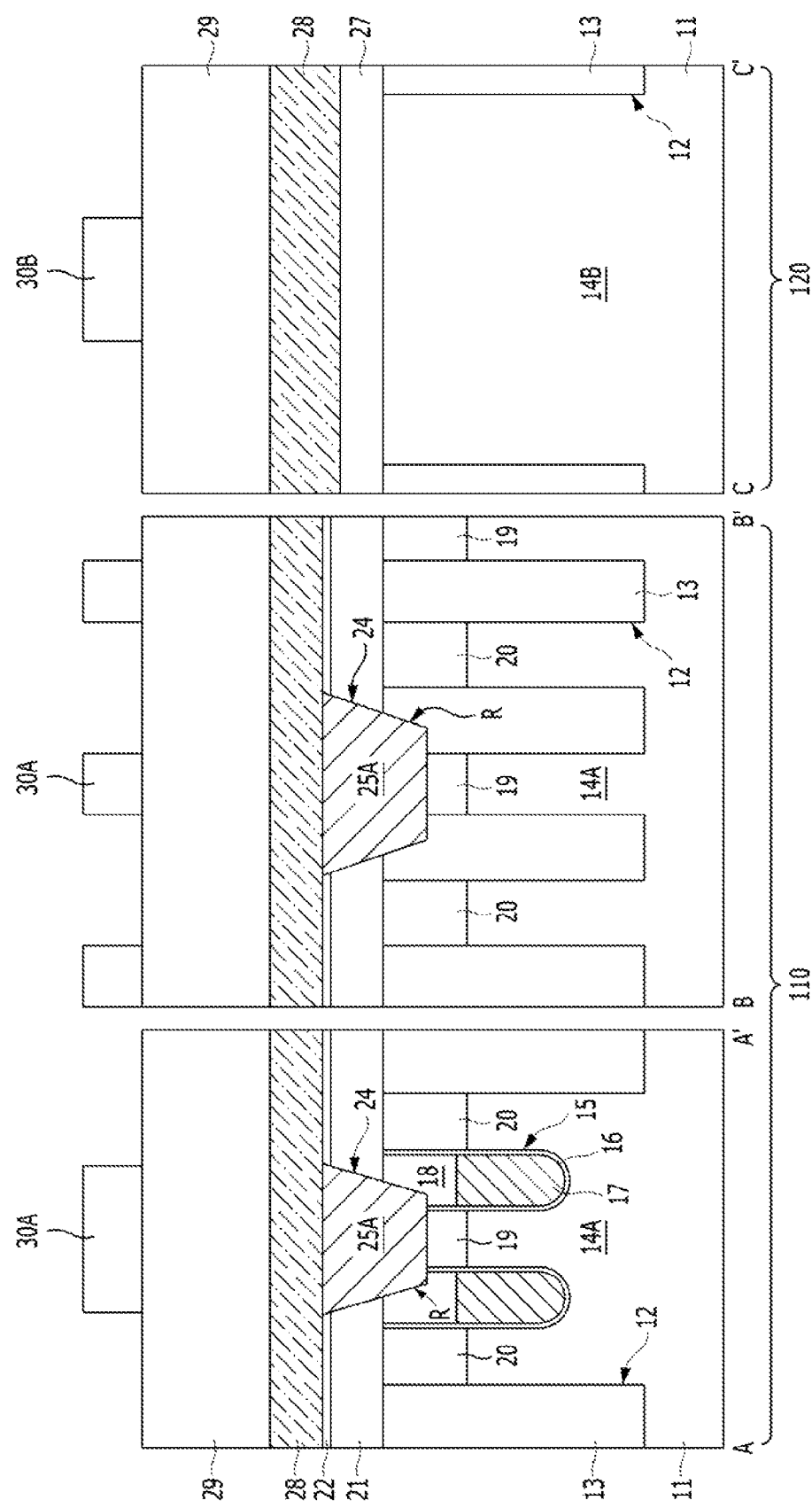

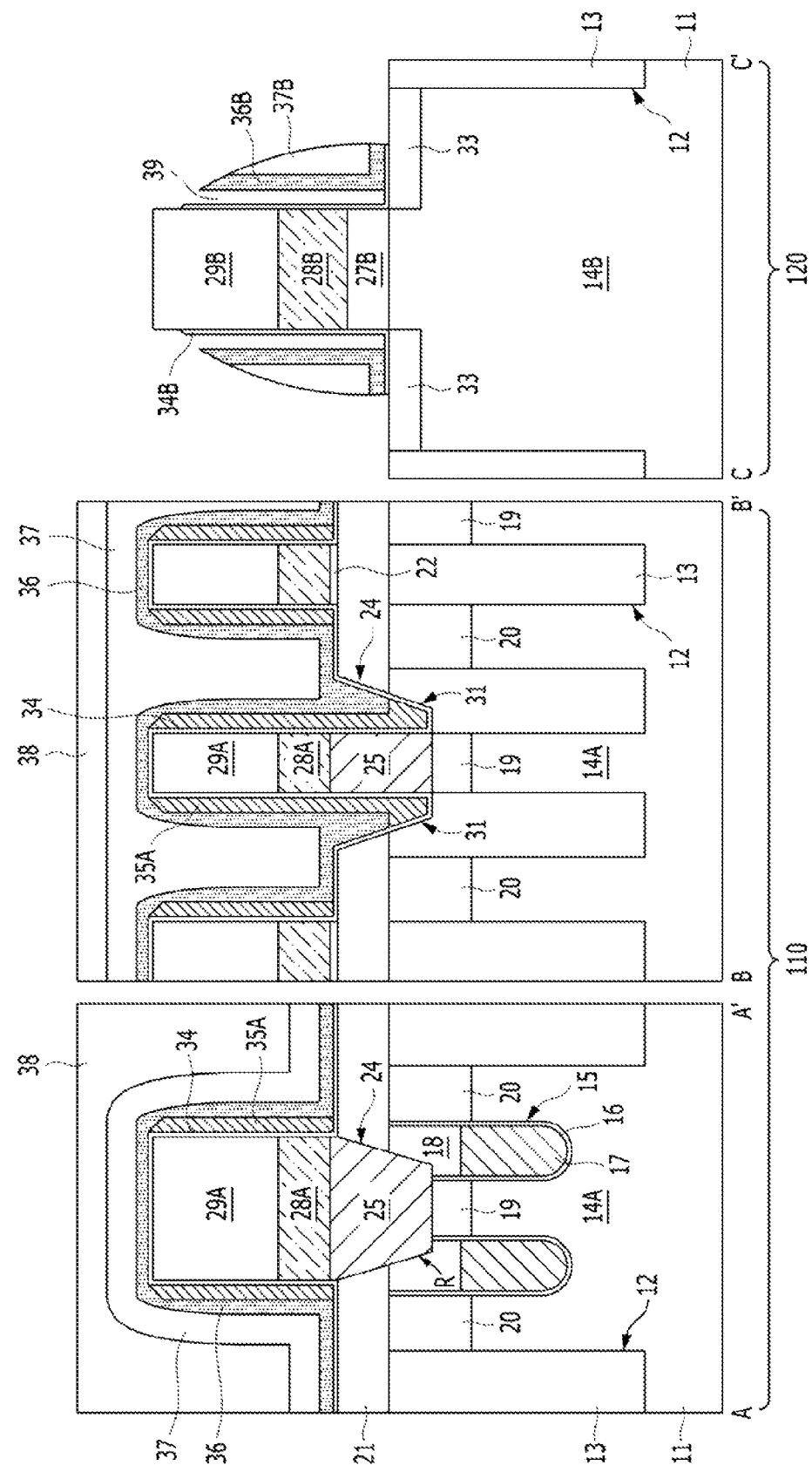

SEMICONDUCTOR DEVICE WITH AIR GAP AND METHOD FOR FABRICATING THE SAME

CROSS-REFERENCE TO RELATED APPLICATION

This application is a continuation of U.S. patent application Ser. No. 14/738,421 filed on. Jun. 12, 2015, which claims priority under 35 U.S.C. §119 to Korean Patent Application No. 10-2014-0183484 filed on Dec. 18, 2014. The disclosure of each of the foregoing applications is herein incorporated by reference in its entirety.

TECHNICAL FIELD

Exemplary embodiments of the present invention relate to a semiconductor device, and more particularly, to a semiconductor device with air gaps and a method for fabricating the same.

DISCUSSION OF THE RELATED ART

In a semiconductor device, a dielectric material is formed between conductive structures. As a semiconductor device is highly integrated, a distance between conductive structures is gradually decreasing. This increases parasitic capacitance. As parasitic capacitance increases, the performance of a semiconductor device is degraded.

To reduce parasitic capacitance a method of decreasing the dielectric constant of a dielectric material may be used. However, since the dielectric material has a high dielectric constant, limitations exist in reducing parasitic capacitance.

SUMMARY

Various embodiments are directed to a semiconductor device capable of reducing the parasitic capacitance between adjacent conductive structures, and a method for fabricating the same.

In an embodiment, a method for fabricating a semiconductor device may include: preparing a substrate which includes a memory cell region and a peripheral circuit region; forming a buried word line in the substrate in the memory cell region; forming a planar gate structure over the substrate in the peripheral circuit region; forming a bit line structure over the substrate in the memory cell region; forming a first air spacer over a sidewall of the planar gate structure; and forming a second air spacer over a sidewall of the bit line structure. The forming of the first air spacer comprises: forming a gate spacer structure including a stack of a first gate spacer, a peripheral sacrificial spacer and a second gate spacer over the sidewall of the planar gate structure; and selectively removing the peripheral sacrificial spacer to form a first air gap, wherein the first air spacer includes a stack of the first gate spacer, the first air gap, and the second gate spacer. The method may further include: forming a first capping layer which caps the first air gap; and forming a capping strengthening layer over the first capping layer. The peripheral sacrificial spacer includes titanium nitride, and wherein each of the first gate spacer, the second gate spacer the first capping layer, and the capping strengthening layer includes silicon nitride. The forming of the second air spacer include: forming a bit line spacer structure including a stack of a first spacer, a cell sacrificial spacer, a second spacer, and a third spacer over the sidewall of the bit line structure; and selectively removing the cell sacrificial spacer to form a second air gap which extends in parallel to the sidewall of the bit line structure, wherein the second air spacer includes a stack of the first spacer, the second air gap, the second spacer, and the third spacer. The method may further include: forming a second capping layer which caps the second air gap. The cell sacrificial spacer includes titanium nitride, and wherein each of the first spacer, the second spacer, the third spacer, and the second capping layer includes silicon nitride. The forming of the planar gate structure and the forming of the bit line structure are simultaneously performed by an etching process using a single mask, wherein the planar gate structure includes a planar gate electrode, wherein the bit line structure includes a bit line, and wherein the planar gate electrode of the planar gate structure and the bit line of the bit line structure include the same conductive material. The forming of the planar gate structure and the forming of the bit line structure include: forming a first interlayer dielectric layer over the substrate in the memory cell region and in the peripheral circuit region; forming a bit line contact hole which passes through the first interlayer dielectric layer in the memory cell region; forming a plug pattern in the bit line contact hole; removing the first interlayer dielectric layer from the peripheral circuit region; forming a gate dielectric layer over the substrate in the peripheral circuit region; forming a conductive layer over the gate dielectric layer in the peripheral circuit region and over the plug pattern and the first interlayer dielectric layer in the memory cell region; etching the conductive layer in the peripheral circuit region to form a planar gate electrode; etching the conductive layer in the memory cell region to form a bit line; and etching the plug pattern to form a first plug which contacts the bit line, wherein the first plug has substantially the same line width as the bit line. The second air spacer includes: a line shape air gap which extends in parallel to the sidewall of the bit line, and a plug type air gap which extends from the line shape air gap to over a sidewall of the first plug.

In an embodiment a method for fabricating a semiconductor device may include: preparing a substrate which includes a memory cell region and a peripheral circuit region; forming a planar gate structure over the substrate in the peripheral circuit region; forming first source/drain regions in the substrate in the peripheral circuit region using the planar gate structure as a mask; stacking a first gate spacer, a first sacrificial spacer, a second gate spacer and a second sacrificial spacer over a sidewall of the planar gate structure; removing the first sacrificial spacer to form an air gap between the first gate spacer and the second gate spacer; forming a second source/drain region in the substrate in the peripheral circuit region by using the planar gate structure, the first gate spacer the second gate spacer, and the second sacrificial spacer as a mask; and removing the second sacrificial spacer. The method may further include: forming a first capping layer which caps the air gap; forming a capping strengthening layer over the first capping layer; forming an interlayer dielectric layer over the capping strengthening layer; etching the interlayer dielectric layer, the capping strengthening layer, and the first capping layer to form a contact hole exposing the second source/drain region; forming an ohmic contact layer in the contact hole to be coupled to the second source/drain region; and forming a contact plug in the contact hole and over the ohmic contact layer. The first sacrificial spacer includes titanium nitride, and wherein each of the first gate, spacer, the second gate spacer the first capping layer, and the capping strengthening layer includes silicon nitride. The stacking of the first gate spacer, the first sacrificial spacer, the second gate spacer, and the second sacrificial spacer include: form ng a first spacer layer over the planar gate structure and the substrate; forming a first sacrificial spacer layer over the first spacer layer; etching the first sacrificial spacer layer to form the first sacrificial spacer over the sidewall of the planar gate structure; forming a second spacer layer over the first sacrificial spacer and the first spacer layer; forming a second sacrificial spacer layer over the second spacer layer; forming a mask pattern which covers the memory cell region and opens the peripheral circuit region; and etching back the second sacrificial spacer layer the second spacer layer, and the first spacer layer by using the mask pattern as an etch mask, to remove the first spacer layer, the second spacer layer, and the second sacrificial spacer layer over the upper surface of the planar gate structure and the substrate, and maintain the second sacrificial spacer, the second gate spacer, and the first gate spacer over the sidewall of the planar gate structure. The forming of the air gap and the forming of the second source/drain region are performed while the memory cell region is protected by the mask pattern. The method may further include: forming a bit line structure over the substrate in the memory cell region, wherein the planar gate structure and the bit line structure are simultaneously formed by an etching process using a single mask, wherein the planar gate structure includes a planar gate electrode, wherein the bit line structure includes a bit line, and wherein the planar gate electrode of the planar gate structure and the bit line of the bit line structure include the same conductive material. The forming of the planar gate structure and the forming of the bit line structure include: forming a cell interlayer dielectric layer over the substrate in the memory cell region and the peripheral circuit region; forming a bit line contact hole which passes through the cell interlayer dielectric layer in the memory cell region; forming a plug pattern in the bit line contact hole; removing the cell interlayer dielectric layer from the peripheral circuit region; forming a gate dielectric layer over the substrate in the peripheral circuit region; forming a conductive layer over the gate dielectric layer the peripheral circuit region and over the plug pattern and the cell interlayer dielectric layer which remains in the memory cell region; etching the conductive layer to form the planar gate electrode in the peripheral circuit region and the bit line in the memory cell region; and etching the plug pattern to form a first plug, wherein the first plug contacts the bit line and has the same line width as the bit line. The method may further include: forming a bit line air spacer extending from over a sidewall of the bit line to over a sidewall of the first plug, wherein the bit line air spacer includes a line shape air gap and a plug type air gap, wherein the line shape air gap extends over the sidewall of the bit line, and wherein the plug type air gap extends from the line shape air gap to over the sidewall of the first plug. The forming of the bit line air spacer include: forming a bit line spacer structure over a sidewall of the bit line structure, wherein the bit line spacer structure includes a cell sacrificial spacer extending from over the sidewall of the bit line to over the sidewall of the first plug; forming a second plug over the bit line spacer structure wherein the second plug includes a first portion provided over the sidewall of the bit line and a second portion extending from the first portion and provided over the sidewall of the first plug, wherein the cell sacrificial spacer extends from between the first portion of the second plug and the sidewall of the bit line to between the second portion of the second plug and the sidewall of the first plug; and removing the cell sacrificial spacer to form the line shape air gap and the plug type air gap. The bit line spacer structure includes a stack of a first silicon nitride layer, the cell sacrificial spacer, and a second silicon nitride layer, and wherein the cell sacrificial spacer include titanium nitride layer, wherein the titanium nitride layer is provided between the first and the second silicon nitride layers.

In an embodiment, a semiconductor device may include: a substrate including a memory cell region and a peripheral circuit region; a buried word line formed in the substrate in the memory cell region; a bit line structure formed in the memory cell region and including a first plug and a bit line, wherein the first plug is electrically coupled to a first impurity region in the memory cell region, wherein the bit line is provided over the first plug; a planar gate structure formed over the substrate in the peripheral circuit region; a gate air spacer including a first air gap and positioned over a sidewall of the planar gate structure; a second plug electrically coupled to a second impurity region in the memory cell region and including a first portion and a second portion, wherein the first portion is provided over a sidewall of the first plug, wherein the second portion extends from the first portion and is provided over a sidewall of the bit line; and a bit line air spacer including a second air gap and positioned between the bit line structure and the second plug. The semiconductor device may further include: a first capping layer which caps the first air gap; and a capping strengthening layer covering the first capping layer. The second air gap includes a line shape air gap and a plug type air gap, wherein the line shape air gap extends in parallel to the sidewall of the bit line, and wherein the plug type air gap extends from the line shape air gap to over the sidewall of the first plug. The semiconductor device may further include: a second capping layer capping the line shape air gap. The semiconductor device may further include: an ohmic contact layer over the second plug; a third plug over the ohmic contact layer; and a memory element over the third plug.

DETAILED DESCRIPTION

Figure 1:
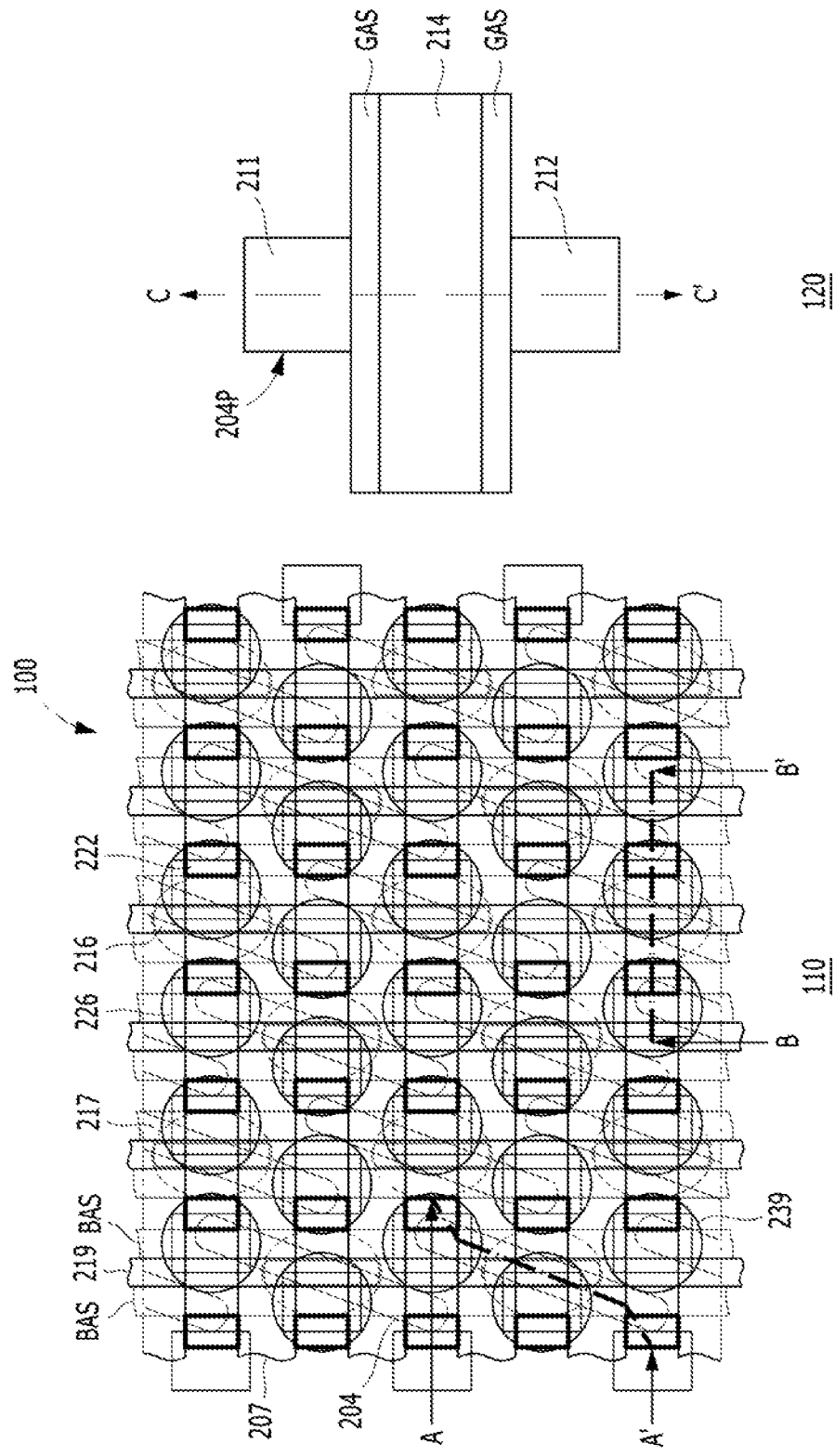
FIG. 1 is a plan view illustrating a semiconductor device in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers, to a case where the first layer is formed directly on the second layer or the substrate but also a case where a third layer exists between the first layer and the second layer or the substrate.

FIG. 1 is a plan view illustrating a semiconductor device in accordance with an embodiment.

Figure 2A:
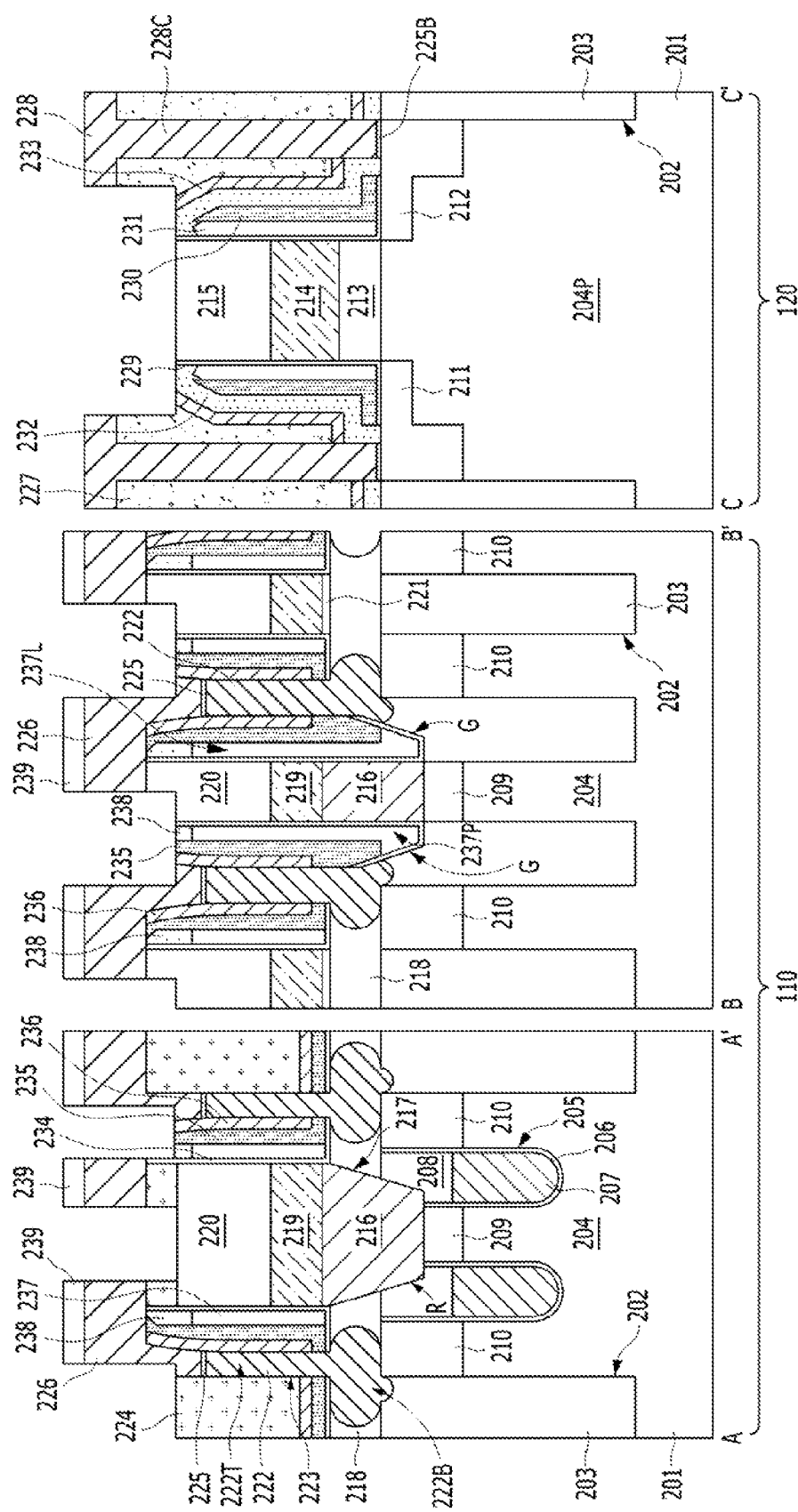
FIG. 2A is a cross-sectional view illustrating the semiconductor device of FIG. 1.
Figure 2B:
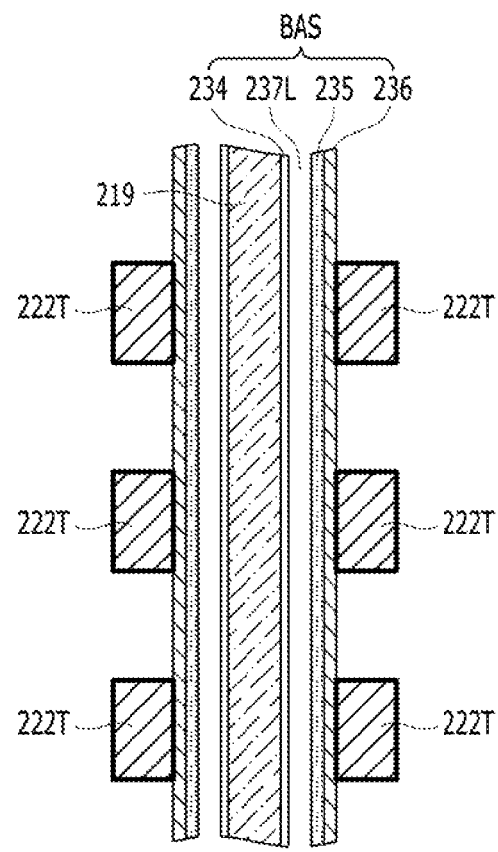
FIG. 2B is a detailed cross-sectional view illustrating a bit line air spacer (BAS).
Figure 2C:
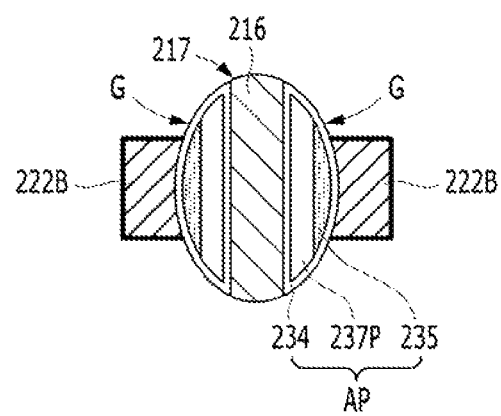
FIG. 2 is a detailed cross-sectional view illustrating an air plug (AP).
FIG. 2D is a detailed cross-sectional view illustrating a gate air spacer (GAS).
Figure 2D:
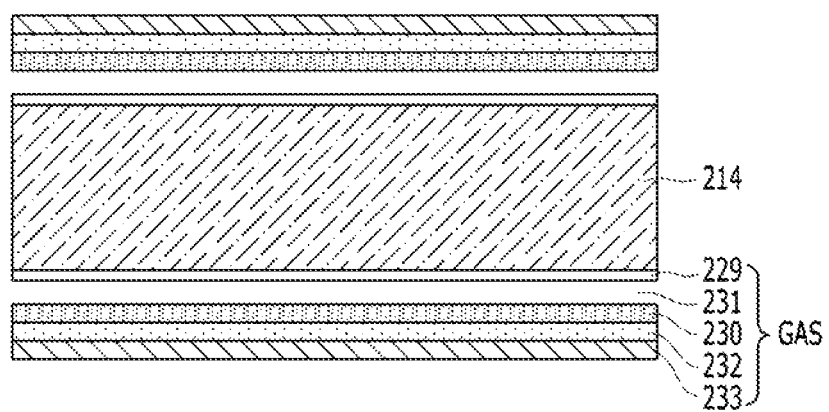

FIG. 2A is a cross-sectional view illustrating the semiconductor device of FIG. 1. FIG. 2A is a cross-sectional view taken along the lines A-A', B-B' and C-C' of FIG. 1. FIG. 2B is a detailed cross-sectional view illustrating a bit line air spacer (BAS). FIG. 2C is a detailed cross-sectional view illustrating an air plug (AP). FIG. 2D is a detailed cross-sectional view illustrating a gate air spacer (GAS).

A semiconductor device 100 may include a memory cell region 110 and a peripheral circuit region 120. A plurality of memory cells may be formed in the memory cell region 110. Each memory cell may include a buried word line 207, a bit line 219, and a memory element 239. A peripheral transistor which constructs a peripheral circuit may be formed in the peripheral circuit region 120. The peripheral transistor may include a planar gate electrode 214.

The semiconductor device 100 will be described below in detail. An isolation layer 203 is formed in a substrate 201. The isolation layer 203 is formed in first trenches 202. The first trenches 202 may be referred to as "isolation trenches". A plurality of active regions 204 and 204P are formed by the isolation layer 203. A plurality of first active regions 204 may be defined by the isolation layer 203 in the memory cell region 110. Also, a second active region 204P may be defined by the isolation layer 203 in the peripheral circuit region 120. The plurality of first active regions 204 may have shapes which are isolated by the isolation layer 203. The isolation layer 203 may include silicon nitride, silicon oxide or a combination thereof.

Second trenches 205 are formed to cross the first active regions 204 and the isolation layer 203. A first gate dielectric layer 206 is formed on the surfaces of the second trenches 205. Buried word lines 207 which partially fill the second trenches 205 are formed on the first gate dielectric layer 206. A sealing layer 208 is formed on the buried word lines 207. The sealing layer 208 may have the same height as the surface of the substrate 201. The buried word lines 207 may be a level lower than the surface of the substrate 201.

A first impurity region 209 and a second impurity region 210 may be formed in the first active region 204. The first impurity region 209 and the second impurity region 210 may be separated from each other by the second trench 205. The first impurity region 209 and the second impurity region 210 may be referred to as a source region and a drain region. The buried word line 207 the first impurity region 209, and the second impurity region 210 may become a buried gate type transistor. The buried gate type transistor may be referred to as a cell transistor. The buried gate type transistor may improve issues due to a short channel effect by employing the buried word line 207. The first impurity region 209 and the second impurity region 210 may be doped with an N-type impurity or a P-type impurity. The top surface of the first impurity region 209 may be lower than the top surface of the second impurity region 210. For example, the first impurity region 209 has a recessed surface.

A third impurity region 211 and a fourth impurity region 212 may be formed in the second active region 204P. Each of the third impurity region 211 and the fourth impurity region 212 may include a low concentration source/drain region and a high concentration source/drain region. The third impurity region 211 and the fourth impurity region 212 may be doped with an N-type impurity or a P-type impurity. A planar gate structure may be formed on the second active region 204P between the third impurity region 211 and the fourth impurity region 212. The planar gate structure may include a second gate dielectric layer 213, a planar gate electrode 214, and a gate hard mask 215. A planar gate type transistor including the planar gate electrode 214, the third impurity region 211 and the fourth impurity region 212 may be formed.

First plugs 216 are formed on the substrate 201 in the memory cell region 110. The first plug 216 is coupled with the first impurity region 209. The first plug 216 is positioned in a first opening 217. The first opening 217 is formed in a first interlayer dielectric layer 218. The first interlayer dielectric layer 218 is formed on the substrate 201. The first opening 217 is a contact hole which exposes the first impurity region 209. The first plug 216 may also be referred to as a bit line contact plug. The bottom surface of the first plug 216 may be lower than the top surface of the substrate 201. The first plug 216 may be formed of a polysilicon or a metal material. The first plug 216 may have a line width that is smaller than the width of the first opening 217. Gaps G are formed on both sides of the first plug 216. In an embodiment, the gaps G are not a surrounding type that surrounds the first plug 216, but are independently formed on both sides of the first plug 216. As a result, one first plug 216 and a pair of gaps G are positioned in the first opening 217, and the pair of gaps G is separated by the first plug 216. The gap G may be positioned between the first plug 216 and a second portion 222B of a second plug 222.

A bit line structure is formed on the first plug 216. The bit line structure includes a bit line 219 and a bit line hard mask 220 on the bit line 219. The bit line structure has a line shape which extends in a direction crossing with the buried word line 207. A portion of the bit line 219 is coupled with the first plug 216. When viewed on the cross-section taken along the line B-B', the bit line 219 and the first plug 216 may have the same line width. Accordingly, the bit line 219 may extend in any one direction while covering the first plug 216. The bit line 219 may extend onto an etch stop layer 221. The etch stop layer 221 is formed on the first interlayer dielectric layer 218 and may be a line shape which has the same line width as the bit line 219. The bit line 219 may include a metal material. The bit line hard mask 220 and the etch stop layer 221 may include a dielectric material. The bit line hard mask 220 and the etch stop layer 221 may be formed of silicon nitride. The bit line 219 and the planar gate electrode 214 may be the same material. The bit line hard mask 220 and the gate hard mask 215 may be the same material.

Second plugs 222 may be formed between neighboring bit line structures. The second plug 222 is formed in a second opening 223. The second plug 222 may be coupled with the second impurity region 210. The second plug 222 may include a first portion 222T and the second portion 222B. The first portion 222T may be disposed adjacent to the bit line 219. The second portion 222B may be disposed adjacent to the first plug 216. The second portion 222B may have a bulb shape. A contact area between the second portion 222B and the second impurity region 210 may be increased.

A plug isolation layer 224 may be formed between neighboring second plugs 222. Portions of the plug isolation layer 224 may extend onto the bit line hard mask 220.

An ohmic contact layer 225 and a third plug 226 may be stacked on the second plug 222. The second plug 222 may include a polysilicon and the third plug 226 may include tungsten. Accordingly, the second plug 222 may be a silicon plug, and the third plug 226 may be a metal plug. The second plug 222 and the third plug 226 may be collectively referred to as a semi-metal plug (SMP). The ohmic contact layer 225 is formed between the second plug 222 and the third plug 226. The ohmic contact layer 225 may include a metal silicide. Contact resistance is decreased by the ohmic contact layer 225. The third plug 226 has an extended part which overlaps with the top portion of the bit line structure. In this structure, the overlap margin of the memory element 239 may be secured.

In the peripheral circuit region 120 metal lines 228 may be formed. The metal line 228 may include a metal contact plug 228C which fills a contact hole (not numbered) in a second interlayer dielectric layer 227. The metal line 228 and the third plug 226 may be positioned at the same level. For example, the metal line 228 and the third plug 226 may be simultaneously formed. The metal line 228 and the third plug 226 may be the same material. The metal lines 228 may be coupled with the third impurity region 211 and the fourth impurity region 212. An ohmic contact layer 225B may be formed under the metal contact plug 228C.

The memory element 239 may be formed on the third plug 226. The memory element 239 may include a capacitor including a storage node. The storage node may have a pillar shape. While not shown, a dielectric layer and a plate node may be additionally formed on the storage node. In another embodiment, the storage node may be in a cylinder shape. In another embodiment a memory element may be realized in a variety of ways and may be coupled with the third plug 226. When the memory element 239 includes a storage node, the stack structure of the second plug 222, the ohmic contact layer 225 and the third plug 226 may be collectively referred to as a storage node contact plug.

A gate air spacer GAS may be formed on each of the sidewalk of the planar gate structure. The gate air spacer GAS may include first air gap 231. The gate air spacer GAS may include a first gate spacer 229, the first air gap 231, and a second gate spacer 230. The first air gap 231 may be capped by a first capping layer 232. A capping strengthening layer 233 may be formed on the sidewall of the first capping layer 232. The first gate spacer 229, the second gate spacer 230, the first capping layer 232, and the capping strengthening layer 233 may include silicon nitride. By forming a spacer by multi-layered silicon nitride, a peripheral transistor may be stabilized.

A dielectric spacer including a second air gap 237 may be positioned between the bit line 219 and the second plug 222 and between the first plug 216 and the second plug 222. The dielectric spacer may include a bit line air spacer BAS and an air plug AP. The second air gap 237 may include a line shape air gap 237L and a plug type air gap 237P. The bit line air spacer BAS includes the line shape air gap 237L. The air plug AP includes the plug type air gap 237P.

The bit line air spacer BAS may include a first spacer 234, the line shape air gap 237L, a second spacer 235, and a third spacer 236. The first spacer 234, the second spacer 235, and the third spacer 236 may extend in parallel to the sidewall of the bit line 219. The line shape air gap 237L may extend parallel to the sidewall of the bit line 219. The line shape air gap 237L may be formed between the first spacer 234 and the second spacer 235. The line shape air gap 237L may be positioned between the first portion that is, an upper portion 222T of the second plug 222 and the bit line 219.

The air plug AP may be formed in the gap G. The air plug AP may be positioned between the first plug 216 and the second portion that is, a lower portion 222B of the second plug 222. The air plug AP includes the first spacer 234, the plug type air gap 237P, and the second spacer 235. The first spacer 234 covers the bottom surface and the sidewalls of the gap G. The second spacer 235 covers the plug type air gap 237P. The plug type air gap 237P may be positioned between the first spacer 234 and the second spacer 235. The plug type air gap 237P may be formed between the second portion that is, the lower portion 222B of the second plug 222 and the first plug 216.

The line shape air gap 237L and the plug type air gap 237P may be positioned in the vertical direction.

The bit line air spacer BAS and the air plug AP may be coupled with each other. The line shape air gap 237L and the plug type air gap 237P may be coupled to each other.

The first spacer 234, the second spacer 235 and the third spacer 236 may be formed of a dielectric material. The first spacer 234, the second spacer 235 and the third spacer 236 may include silicon nitride.

The top portion of the line shape air gap 237L is capped by a second capping layer 238. The second capping layer 238 may be formed of a dielectric material.

According to the above-described embodiment, the parasitic capacitance between the bit line 219 and the second plug 222 may be reduced by the line shape air gap 237L. Also, the parasitic capacitance between the first plug 216 and the second plug 222 may be reduced by the plug type air gap 237P. Moreover, the parasitic capacitance between the planar gate electrode 214 and the metal contact plug 228C may be reduced by the first air gap 231.

As may be seen from the above descriptions, since parasitic capacitance is reduced, the sensing margin of a memory cell may be improved, and the operation speed of a peripheral transistor may be increased.

Also, since gate spacers of the planar gate structure in the peripheral region are reinforced, the peripheral transistor may be stabilized.

Figure 3A:
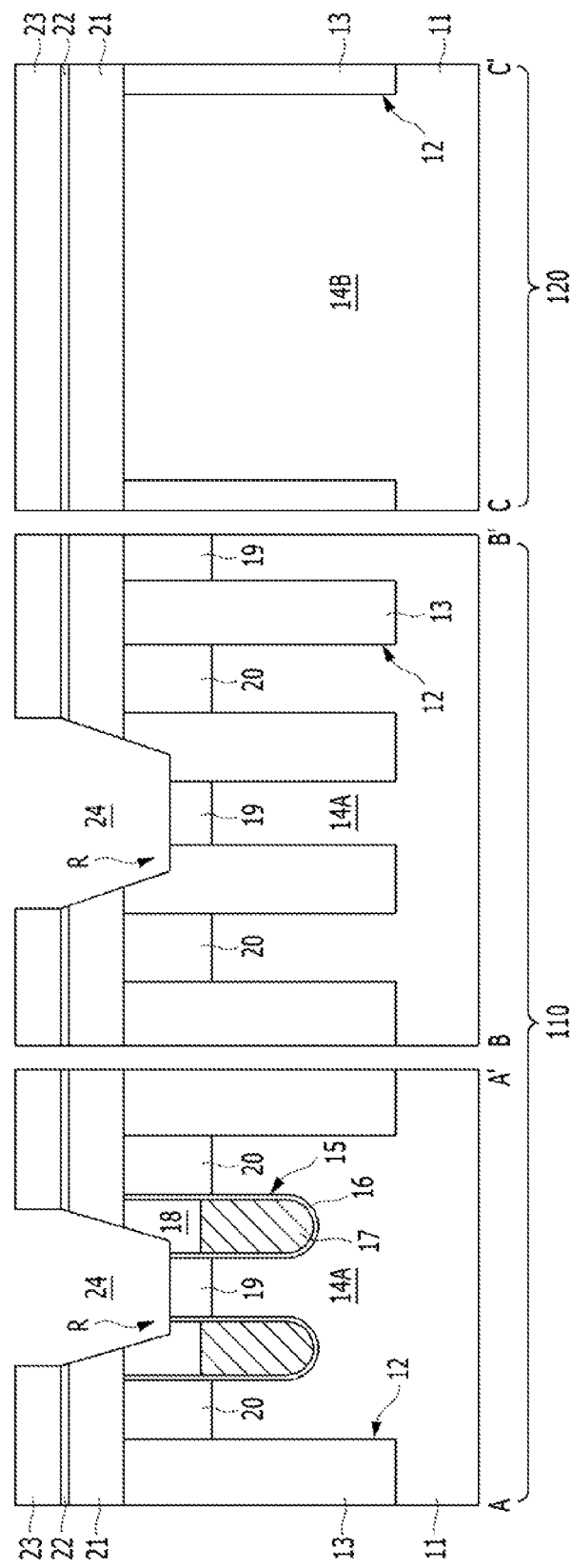
FIGS. 3A to 3O are cross-sectional views describing an example of a method for fabricating a semiconductor device in accordance with an embodiment.

FIGS. 3A to 3O are cross sectional views describing an example of a method for fabricating a semiconductor device in accordance with an embodiment.

As shown in FIG. 3A, a substrate 11 is prepared. The substrate 11 may include a memory cell region 110 and a peripheral circuit region 120. A plurality of memory cells may be formed in the memory cell region 110. A peripheral transistor which constructs a peripheral circuit may be formed in the peripheral circuit region 120. The substrate 11 may include a semiconductor material. The substrate 11 may include a silicon substrate, a silicon germanium substrate or a silicon-on-insulator (SOI) substrate.

An isolation layer 13 may be formed in the substrate 11. The isolation layer 13 may be formed through a shallow trench isolation (STI) process. The isolation layer 13 is formed in first trenches 12. The first trenches 12 may also be referred to as 'isolation trenches'. A plurality of first active regions 14A may be defined in the memory cell region 110 by the isolation layer 13. Also, a second active region 14B may be defined in the peripheral circuit region 120 by the isolation layer 13. The plurality of first active regions 14A may have shapes which are isolated by the isolation layer 13. The isolation layer 13 may include silicon nitride, silicon oxide or a combination thereof.

A plurality of second trenches 15 may be formed in the memory cell region 120. The second trenches 15 may be formed by etching the substrate 11. The second trenches 15 may have a depth shallower than the first trenches 12. The second trenches 15 may have line shapes which extend in a first direction. The second trenches 15 may be formed by etching the first active regions 14A and the isolation layer 13. The second trenches 15 may be formed to cross the first active regions 14A and the isolation layer 13. The second trench 15 may include a first portion and a second portion (not shown). The first portion and the second portion of the second trench 15 may be continuous. The first portion of the second trench 15 may be formed in the first active region 14A, and the second portion of the second trench 15 may be formed in the isolation layer 13. In another embodiment, the second portion of the second trench 15 may have a depth deeper than the first portion to form a fin region (not shown). The fin region may also be referred to as a ° fin channel region'. The bottom corner of the second trench 15 may have a rounded profile. When the rounded profile is formed on the bottom corner of the second trench 15, current leakage may be improved. The second trenches 15 may also be referred to as 'gate trenches'.

A first gate dielectric layer 16 may be formed. The first gate dielectric layer 16 may be formed in the memory cell region 110. The first gate dielectric layer 16 may also be referred to as a cell gate dielectric layer. The first gate dielectric layer 16 may be formed on the bottoms and the sidewalls of the second trenches 15. The first gate dielectric layer 16 may be formed through thermal oxidation. In another embodiment, the first gate dielectric layer 16 may be formed through chemical vapor deposition (CVD) or atomic layer deposition (ALD). The first gate dielectric layer 16 may include a high-k material, an oxide a nitride, an oxynitride or a combination thereof. The high-k material may be a dielectric material which has a dielectric constant higher than an oxide or a nitride. For example, the high-k material may include hafnium oxide ($HfO_2$), hafnium silicate (HfSiO), hafnium silicate nitride (HfSiON) or a combination thereof.

A plurality of buried word lines 17 may be formed in the memory cell region 110. The buried word lines 17 may cross the plurality of first active regions 14A. A gate conductive layer (not shown) may be formed on the first gate dielectric layer 16 and fill the second trenches 15. By etching back the gate conductive layer, the buried word lines 17 may be formed to be positioned in the second trenches 15. The buried word lines 17 may extend in the first direction. The top surfaces of the buried word lines 17 may be positioned at a level lower than the top surfaces of the first active regions 14A. The distance between the buried word lines 17 and a plug, which will be subsequently formed, may be lengthened. The buried word lines 17 may include titanium, tantalum, tungsten, tantalum nitride, titanium nitride, tungsten nitride or a combination thereof. For example, buried word lines 17 may be formed by stacking tungsten (W) on titanium nitride (TiN). In another embodiment, the buried word lines 17 may include a work function metal layer.

A pair of second trenches 15 may cross the first active region 14A. Accordingly, a pair of buried word lines 17 may cross the first active region 14A. A plurality of buried word lines 17 may extend parallel in the first direction.

A sealing layer 18 may be formed on the buried word lines 17. The sealing layer 18 may fill the second trenches 15 and be provided on the buried word lines 17. The sealing layer 18 may play the role of protecting the buried word lines 17 in a subsequent process. The top surface of the sealing layer 18 may be positioned at the same level as the top surfaces of the first active regions 14A. The sealing layer 18 may include a dielectric material. The sealing layer 18 may include silicon oxide, silicon nitride or a combination thereof.

An impurity may be doped into the first active regions 14A by using the sealing layer 18 as a mask to form a first impurity region 19 and a second impurity region 20 in the first active region 14A. The first impurity region 19 and the second impurity region 20 may be formed in the first active region 14A on both sides of the second trench 15. The first impurity region 19 may be formed in the first active region 14A between the pair of buried word lines 17. A pair of second impurity regions 20 may be respectively formed in both lateral edge regions of the first active region 14A.

As will be described later, a first plug may be coupled to the first impurity region 19, and second plugs may be coupled to the second impurity regions 20. To form the first impurity region 19 and the second impurity regions 20, a doping process such as implantation, plasma doping (PLAID), and so forth may be performed. The first impurity region 19 and the second impurity regions 20 may be doped with the same conductivity type impurity, for example, an N-type impurity.

The first impurity region 19 and the second impurity region 20 may serve as a source region and a drain region, respectively. As a result, a plurality of buried gate type transistors each including the buried word line 17, the first impurity region 19 and the second impurity region 20 may be formed in the memory cell region 110. A pair of buried gate type transistors may be formed in the first active region 14k The pair of buried gate type transistors may share the first impurity region 19. As the buried word line 17 is buried in the second trench 15, a channel region under the buried word line 17 may have a three-dimensional structure. A channel length may be increased. As a result, a short channel effect may be minimized.

A first interlayer dielectric layer 21 may be formed on the substrate 11. An etch stop layer 22 may be formed on the first interlayer dielectric layer 21. The first interlayer dielectric layer 21 may include silicon oxide, silicon nitride, a low-k material or a combination thereof. In an embodiment, the etch stop layer 22 may include silicon nitride.

A first opening 24 may be formed in the memory cell region 110. The first opening 24 may be formed by etching the etch stop layer 22 and the first interlayer dielectric layer 21 using a first mask pattern 23 as an etch mask. The first mask pattern 23 may include a photoresist pattern. The first mask pattern 23 may cover the peripheral circuit region 120. When viewed from the top, the first opening 24 may have a circular or oval shape. The first opening 24 may be also referred to as a "contact hole" In a subsequent process, a first plug may be formed in the first opening 24. A portion of the substrate 11 is exposed by the first opening 24. For example, the first impurity region 19 may be exposed by the first opening 24. The first opening 24 may have a diameter that is controlled to result in a predetermined line width. The first opening 24 may be formed wider than the first impurity region 19. Accordingly, by the first opening 24, portions of the isolation layer 13 and the sealing layer 18 may be exposed around the first impurity region 19.

Next, the first impurity region 19 may be recessed to a predetermined depth (see the reference symbol R). The recessed surface of the first impurity region 19 may be positioned at a level lower than the top surface of the substrate 11. As recessing is performed, the contact resistance between the first impurity region 19 and the first plug, which will be subsequently formed, may be improved. Not only the first impurity region 19 but also a portion of the isolation layer 13 and a portion of the sealing layer 18 neighboring the first impurity region 19 may be recessed. The recess R may be coupled to the first opening 24. The top surfaces of the first impurity region 19, the isolation layer 13 and the sealing layer 18 which are exposed by the recess R may be located at a level, lower than the top surface of the substrate 11. When the recess R is formed, the top corner of the first opening 24 may be rounded.

Figure 3B:
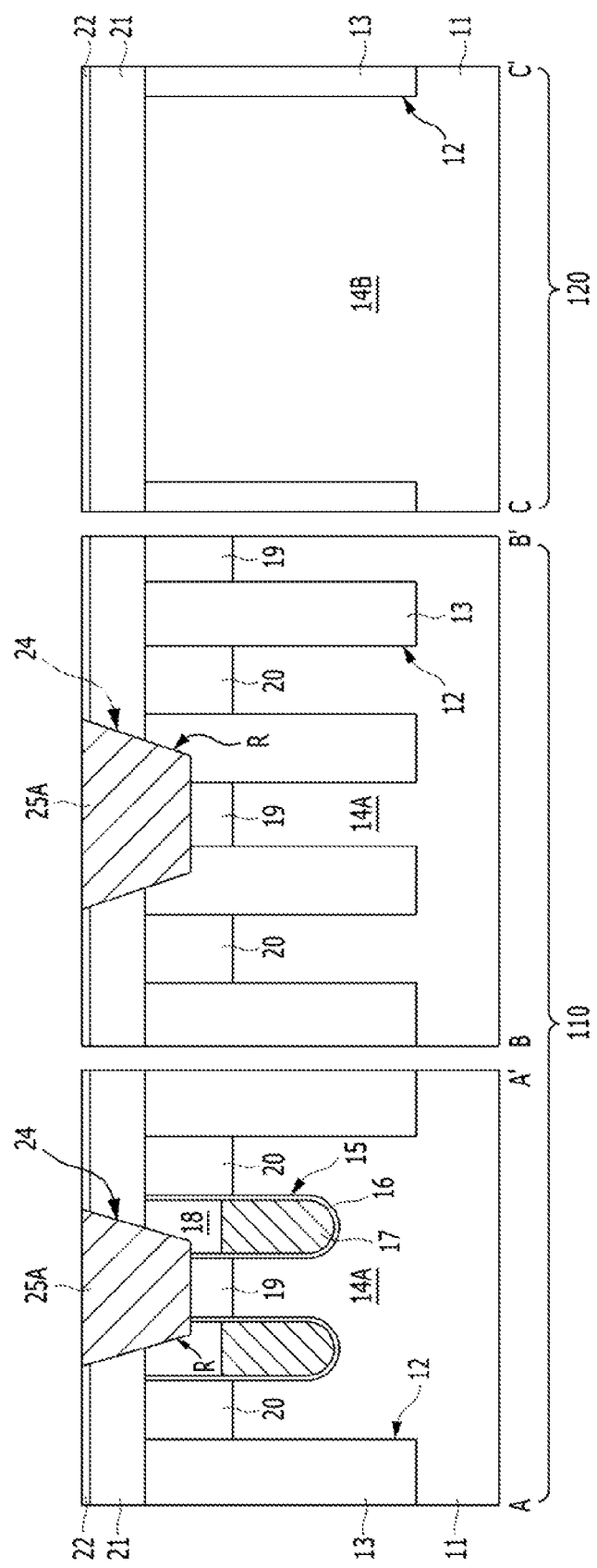

As shown in FIG. 3B, the first mask pattern 23 is removed. A first plug pattern 25A may be formed in the first opening 24. A method for forming the first plug pattern 25A will be described below. First, a conductive layer (not shown) is formed on the etch stop layer 22 to fill the first opening 24 and the recess R. Then, the conductive layer is planarized such that the surface of the etch stop layer 22 is exposed to form the first plug pattern 25A which fills the first opening 24 and the recess R. The surface of the first plug pattern 25A may be formed at the same level as or at a lower level than the surface of the etch stop layer 22. The first plug pattern 25A may be doped with an impurity. For example, an impurity may be doped by a doping process such as implantation. In an embodiment, the first plug pattern 25A may include a polysilicon. In another embodiment, the first plug pattern 25A may be formed of a metal-containing material. The first plug pattern 25A and the first impurity region 19 may be coupled.

Figure 3C:
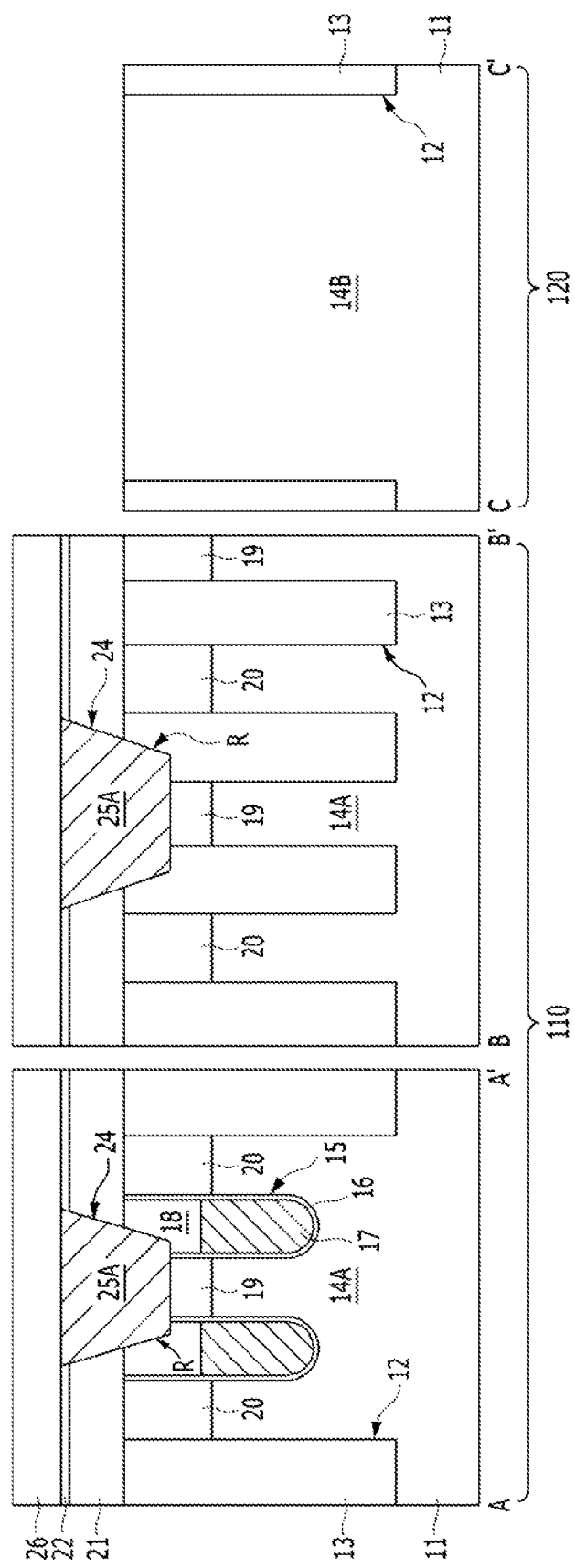

As shown in FIG. 3C, a second mask pattern 26 may be formed. The second mask pattern 26 which covers the memory cell region 110 and opens the peripheral circuit region 120 may be formed. The second mask pattern 26 may a lso be referred to as a peripheral circuit region open mask (POM). The etch stop layer 22 and the first interlayer dielectric layer 21 are removed using the second mask pattern 26 as an etch mask. As a result, in the peripheral circuit region 120, the surface of the substrate 11 may be exposed. The first interlayer dielectric layer 21 remaining in the memory cell region 110 may also be referred to as a cell interlayer dielectric layers'.

Figure 3D:
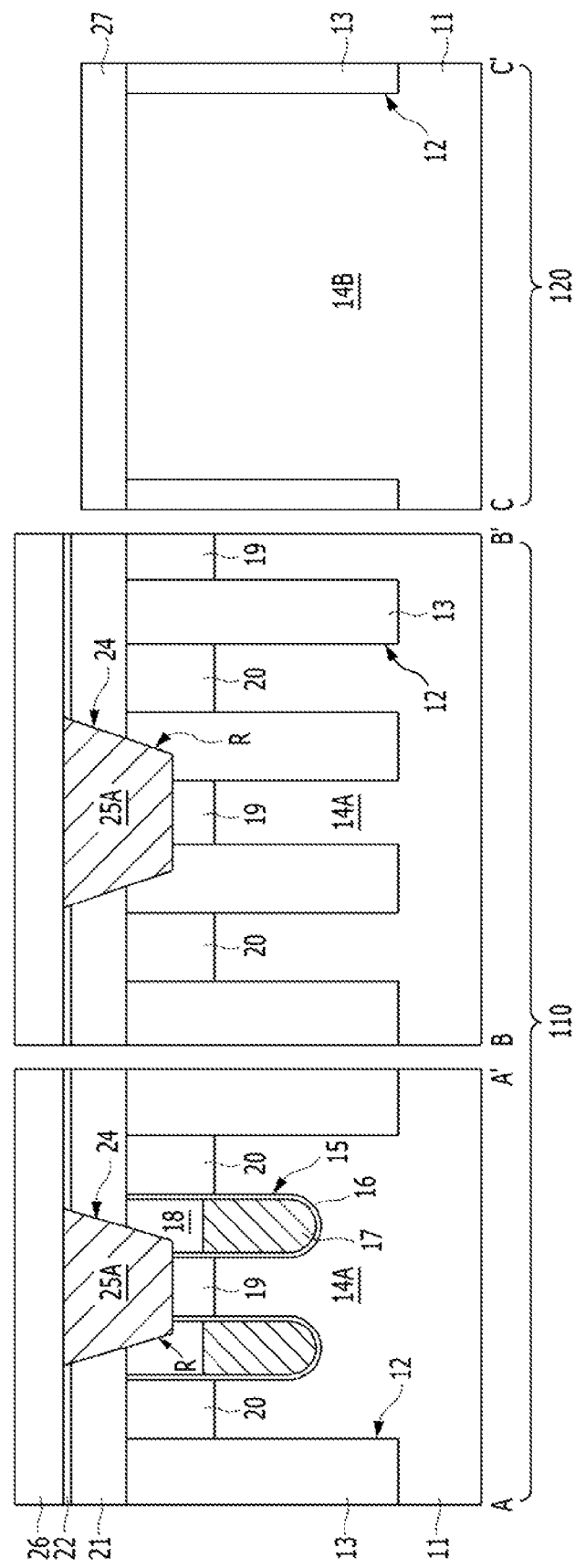

As shown in FIG. 3D, a second gate dielectric layer 27 may be formed on the substrate 11 in the peripheral circuit region 120. The second gate dielectric layer 27 may also be referred to as a peripheral gate dielectric layer. The second gate dielectric layer 27 may include a high-k material, an oxide, a nitride, an oxynitride or a combination thereof. For example, the high-k material may include hafnium oxide (HfO$_2$) hafnium silicate (HfSiO), hafnium silicate nitride (HfSiON) or a combination thereof. The second gate dielectric layer 27 may further include an interface layer (not shown). The interface layer may include silicon oxide, silicon nitride or a combination thereof. The second gate dielectric layer 27 may be formed in such a manner that an interface layer and a high-k material are stacked. While the second gate dielectric layer 27 is formed, the memory cell region 110 is covered by the second mask pattern 26.

As shown in FIG. 3E, the second mask pattern 26 is removed. The surfaces of the first plug pattern 25A and the etch stop layer 22 are exposed in the memory cell region 110, and the top surface of the second gate dielectric layer 27 is exposed in the peripheral circuit region 120.

A bit line conductive layer 28 may be formed. The bit line conductive layer 28 may be formed on the second gate dielectric layer 27, the first plug pattern 25A and the etch stop layer 22. A hard mask layer 29 is formed on the bit line conductive layer 28. The bit line conductive layer 28 may be formed of a material which has a specific resistivity lower than the first plug pattern 25A. The bit line conductive layer 28 may include a metal material which has a specific resistivity lower than the first plug pattern 25A. For example, the bit line conductive layer 28 may include a metal, a metal nitride, a metal silicide or a combination thereof. In an embodiment, the bit line conductive layer 28 may include tungsten (W) or a tungsten compound. The bit line conductive layer 28 may be formed by stacking a barrier layer and a metal layer. The barrier layer may include titanium nitride, tantalum nitride, tungsten nitride or a combination thereof. The metal layer may include tungsten or aluminum. The hard mask layer 29 may be formed of a dielectric material which has etch selectivity with respect to the bit line conductive layer 28 and the first plug pattern 25A. The hard mask layer 29 may include silicon oxide, silicon nitride, silicon oxynitride or a combination thereof. In an embodiment, the hard mask layer 29 is formed of silicon nitride.

Third mask patterns 30A and 306 are formed on the hard mask layer 29. The third mask patterns 30A and 306 may include photoresist patterns. The third mask patterns 30A and 306 may include bit line masks 30A and a peripheral gate mask 30B. The bit line mask 30A has a line shape which extends in a second direction. For example, the bit line masks 30A may extend in a direction crossing with the buried word lines 17. The bit line mask 30A may have a line width smaller than the width of the first opening 24. The peripheral gate mask 30B may extend in the second direction. In another embodiment, the peripheral gate mask 30B may extend in a direction other than the second direction.

Figure 3F:
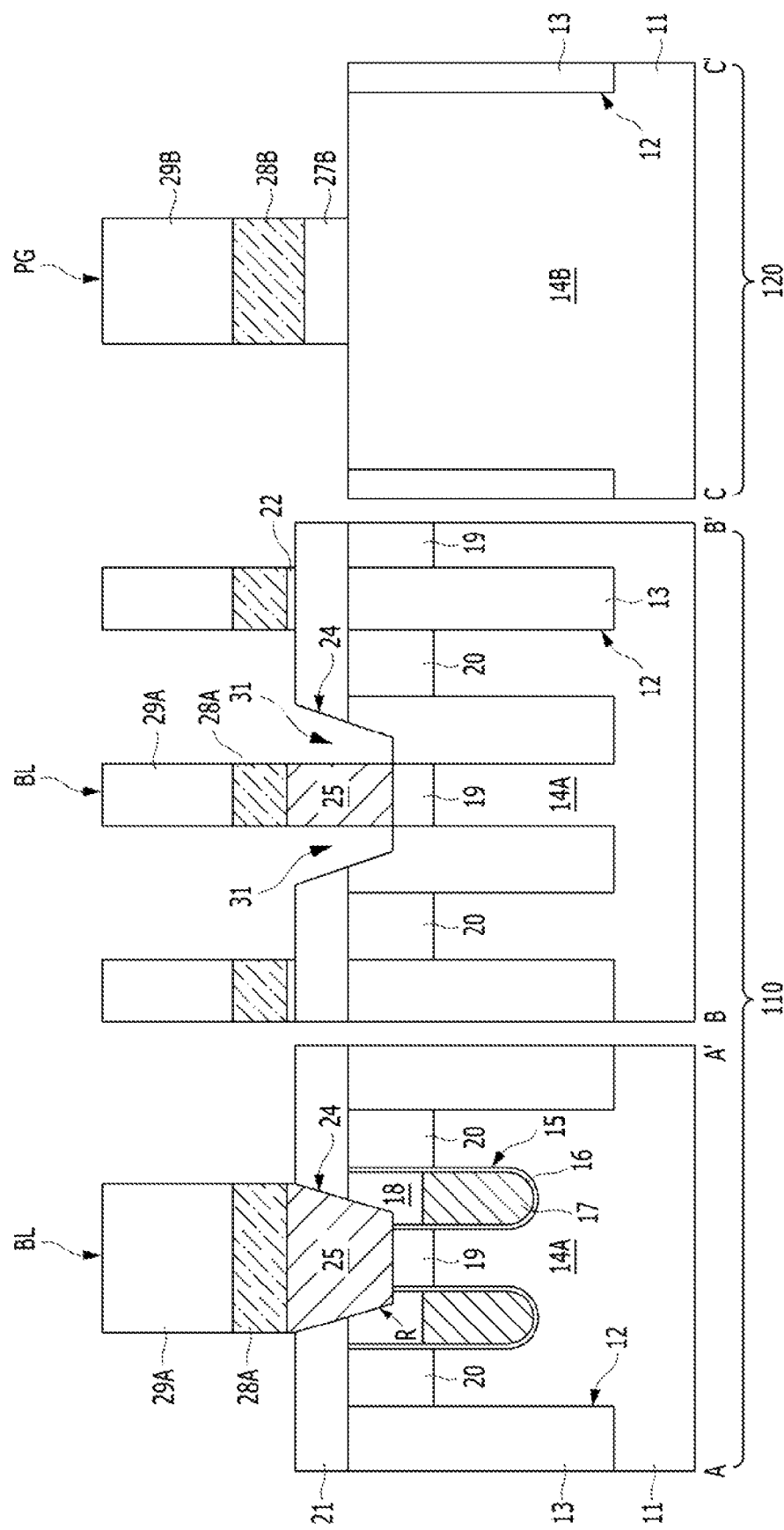

As shown in FIG. 3F, bit line structures BL and a planar gate structure PG may be formed. The bit line structures BL may be formed in the memory cell region 110, and the planar gate structure PG may be formed in the peripheral circuit region 120.

A method for forming the bit line structures BL will be described below. The hard mask layer 29 and the bit line conductive layer 28 are etched using the bit line mask 30A as an etch mask. As a result, a bit line 28A and a bit line hard mask 29A may be formed. The etching process for the bit line conductive layer 28 to form the bit line 28A may stop at the etch stop layer 22. The bit line hard mask 29A is formed by etching the hard mask layer 29.

The etch stop layer 22 is etched using the bit line mask 30A as an etch mask. The etched etch stop layer 22 may have the same line width as the bit line 28A.

The first plug pattern 25A is etched using the bit line mask 30A as an etch mask to form a first plug 25. The first plug pattern 25A may have the same line width as the bit line 28A. The first plug 25 is formed on the first impurity region 19. The first plug 25 couples the first impurity region 19 and the bit line 28A with each other. The first plug 25 is formed in the first opening 24 and the recess R. The line width of the first plug 25 is smaller than the diameter of the first opening 24. Accordingly, gaps 31 may be formed on both sides of the first plug 25.

A method for forming the planar gate structure PG will be described below. The hard mask layer 29 and the bit line conductive layer 28 are etched using the peripheral gate mask 30B as an etch mask. A planar gate electrode 28B and a gate hard mask 29B may be formed. The planar gate electrode 28B is formed by etching the bit line conductive layer 28. The gate hard mask 29B is formed by etching the hard mask layer 29.

Subsequently, the second gate dielectric layer 27 is etched using the peripheral gate mask 30B as an etch mask. A second gate dielectric layer 273 may be formed in the peripheral circuit region 120.

The bit line structures BL and the planar gate structure PG may be simultaneously formed through a single etching process. Thus, an etching process may be simplified.

As the first plug 25 is formed as described above, the gaps 31 are formed in the first opening 24. This is due to the first plug 25 being formed smaller than the diameter or width of the first opening 24. The gaps 31 are not a surrounding type that surrounds the first plug 25, but are independently formed on both sides of the first plug 25. As a result, one first plug 25 and a pair of gaps 31 are positioned in the first opening 24, and the pair of gaps 31 are separated by the first plug 25.

The bit line structure BL may include the first plug 25, the bit line 28A, and the bit line hard mask 29A. The bit line 28A may extend in the second direction while covering the first plug 25. For example, the bit line 28A extends in a direction crossing the buried word line 17. The bit line 28A extends on the etch stop layer 22 and has a line shape, and a portion of the bit line 28A is coupled with the first plug 25. The bit line 28A may be electrically coupled with the first impurity region 19 by the first plug 25.

While forming the first plug 25, the isolation layer 13 and the sealing layer 18 around the first plug 25 may be over-etched. After forming the bit line structure BL and the planar gate structure PG, the bit line mask 30A and the peripheral gate mask 30B may be removed.

Figure 3G:
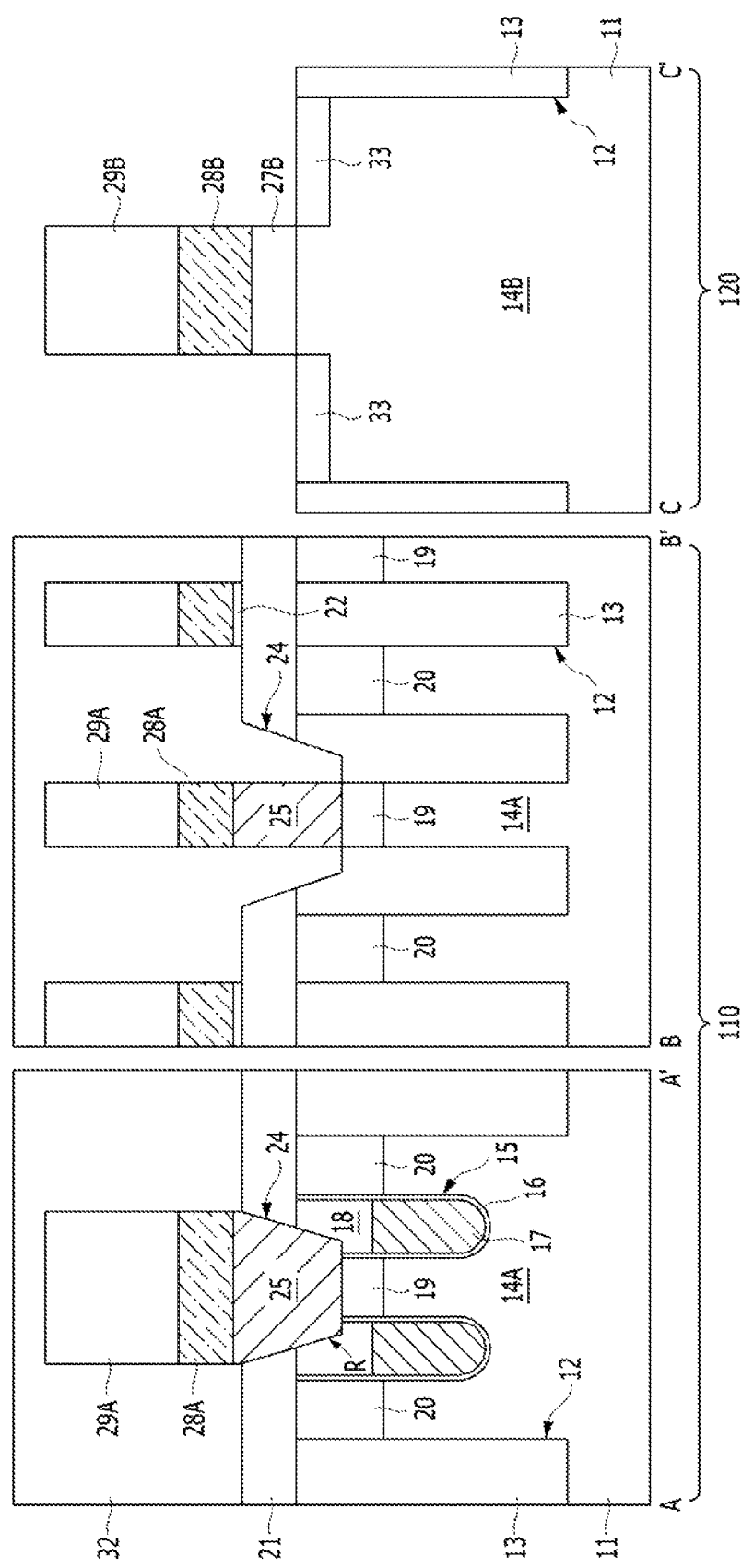

As shown in FIG. 3G, a fourth mask pattern 32 which covers the memory cell region 110 may be formed. The fourth mask pattern 32 may include a photoresist pattern. The fourth mask pattern 32 may cover the memory cell region 110 and open the peripheral circuit region 120.

An impurity may be doped using the fourth mask pattern 32. First source/drain regions 33 may be formed in the second active region 14B on both sides of the planar gate structure. The first source/drain regions 33 may include an N-type impurity or a P-type impurity. The first source/drain regions 33 may also be referred to as low density source/drain regions. Subsequently, a cleaning process may be performed.

Figure 3H:
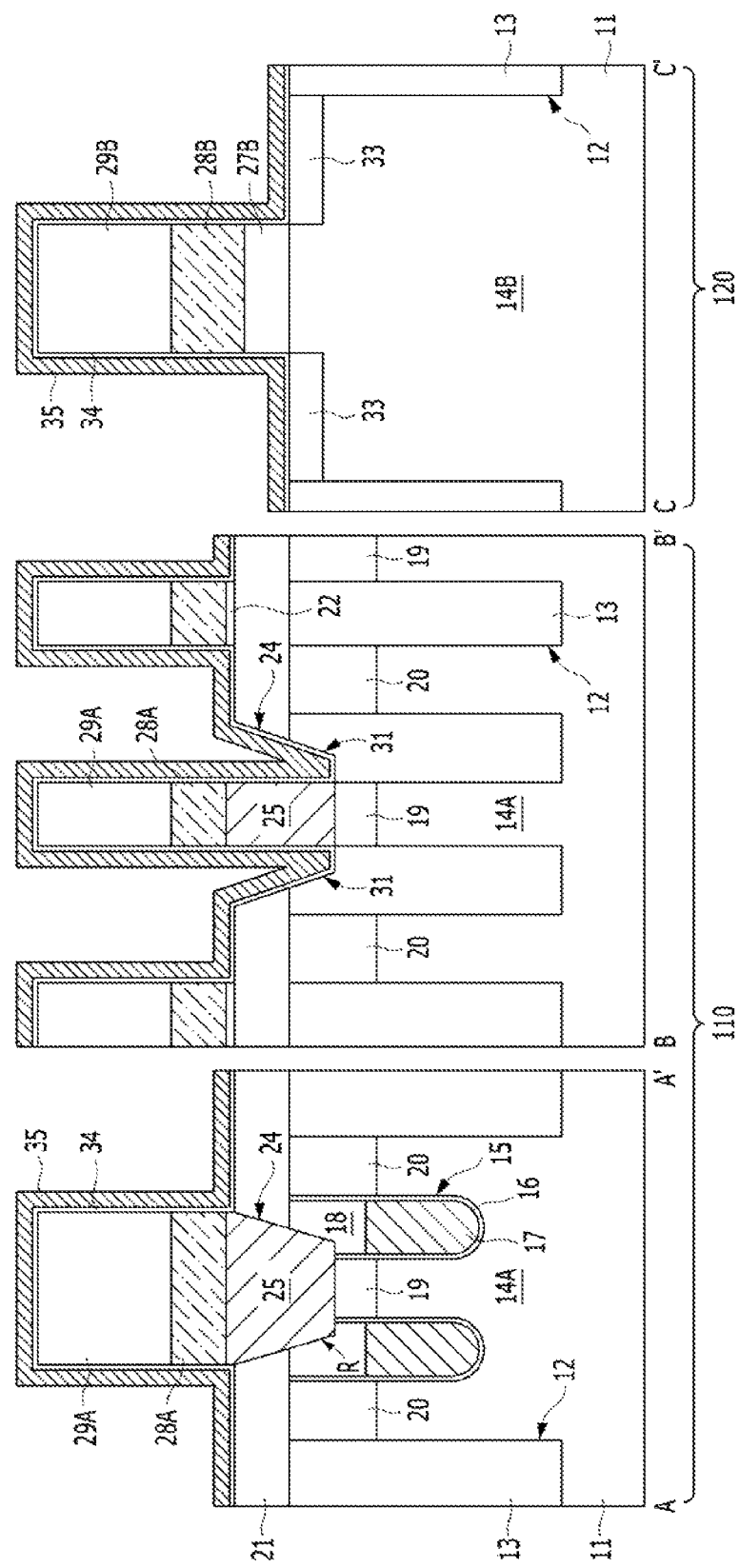

As shown in FIG. 3H, the fourth mask pattern 32 is removed. A first spacer layer 34 may be formed on the bit line structure. The first spacer layer 34 may be conformally formed. The first spacer layer 34 may also be formed on the planar gate structure. The first spacer layer 3' be formed of a low-k material to reduce parasitic capacitance. In another embodiment, the first spacer layer 34 may be formed of another dielectric material. For example, the first spacer layer 34 may include silicon oxide or silicon nitride. Hereinafter, the first spacer layer 34 includes silicon nitride. In the memory cell region 110, the first spacer layer 34 may not fill the gaps 31 and be formed conformally. The first spacer layer 34 may protect the bit line 28A and the first plug 25 from a subsequent process.

A first sacrificial spacer layer 35 may be formed on the first spacer layer 34. Phe first sacrificial spacer layer 35 may be formed of a material which has etch selectivity with respect to the first spacer layer 34. The first sacrificial spacer layer 35 may include a metal nitride. Hereinafter, the first sacrificial spacer layer 35 may include titanium nitride (TiN). The first sacrificial spacer layer 35 may be formed to fill the gaps 31 on the first spacer layer 34. The first sacrificial spacer layer 35 may include silicon oxide with a high etch rate. Silicon oxide with a high etch rate may be etched more quickly than genera silicon oxide under the same etching condition.

Figure 3I:
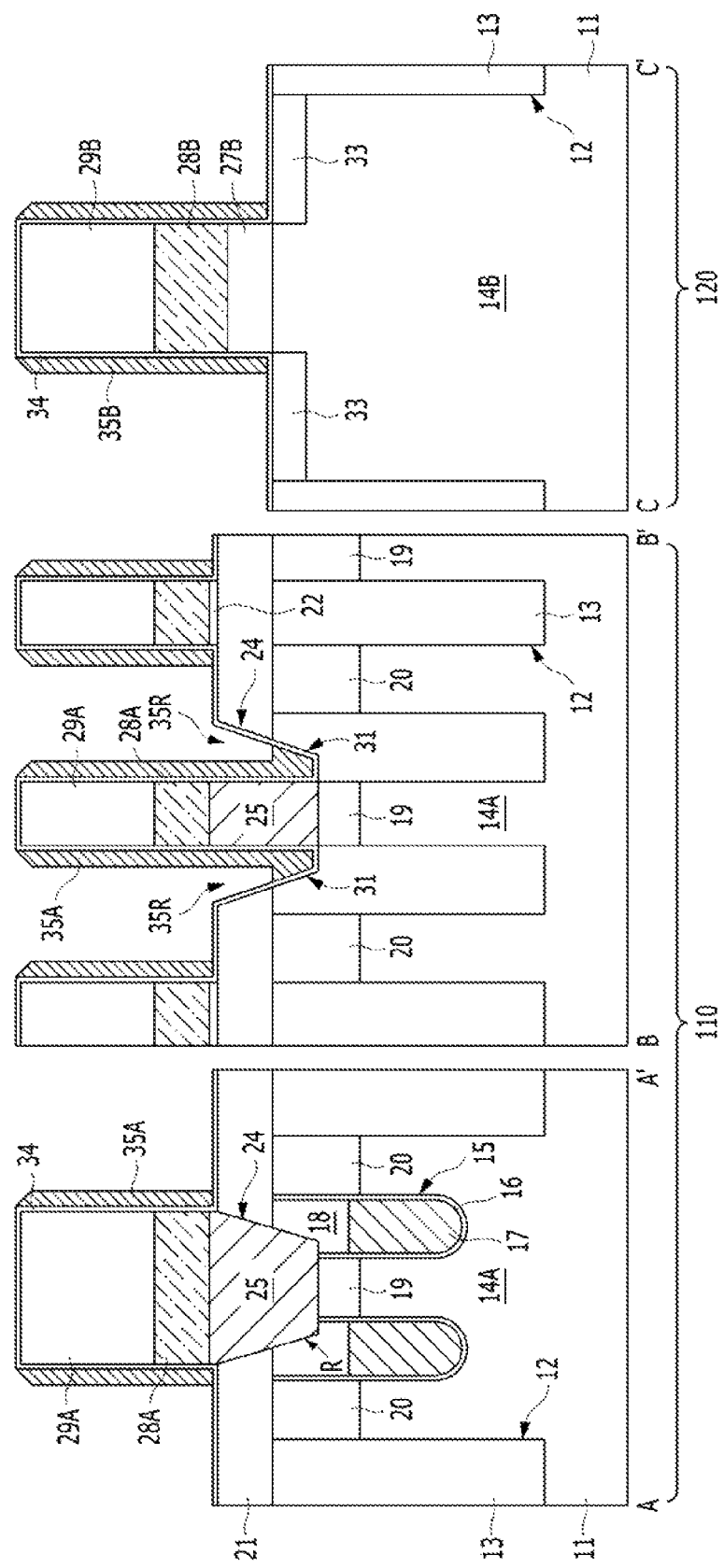

As shown in FIG. 3I, cell sacrificial spacers 35A and first peripheral sacrificial spacers 35B are formed. The cell sacrificial spacers 35A and the first peripheral sacrificial spacers 35B are formed by etching the first sacrificial spacer layer 35. The first sacrificial spacer layer 35 may be etched by an etch-back process. The cell sacrificial spacers 35A are formed on the first spacer layer 34 on the sidewalls of the first plug 25. The bottom portions of the cell sacrificial spacers 35A may extend into the gaps 31. That is, the first sacrificial spacer layer 35 on the surface of the interlayer dielectric layer 21 is removed but the first sacrificial spacer layer 35 in the gaps 31 remains. The cell sacrificial spacers 35A may be positioned on both sidewalls of the bit line structure. The top portions of the cell sacrificial spacers 35A may be positioned at a level lower than the top surface of the bit line hard mask 29A. The partial sidewalls of the gaps 31 may not be covered by the cell sacrificial spacers 35A. The resultant gaps may be referred to as recessed gaps 35R. Between neighboring cell sacrificial spacers 35A, the recessed gap 35R is provided.

The first peripheral sacrificial spacers 35B may be formed on both sidewalls of the planar gate structure. The first peripheral sacrificial spacers 35B are formed on the sidewalls of the first spacer layer 34. The top portions of the first peripheral sacrificial spacers 35B may be positioned at a level lower than the top surface of the gate hard mask 29B.

Figure 3J:
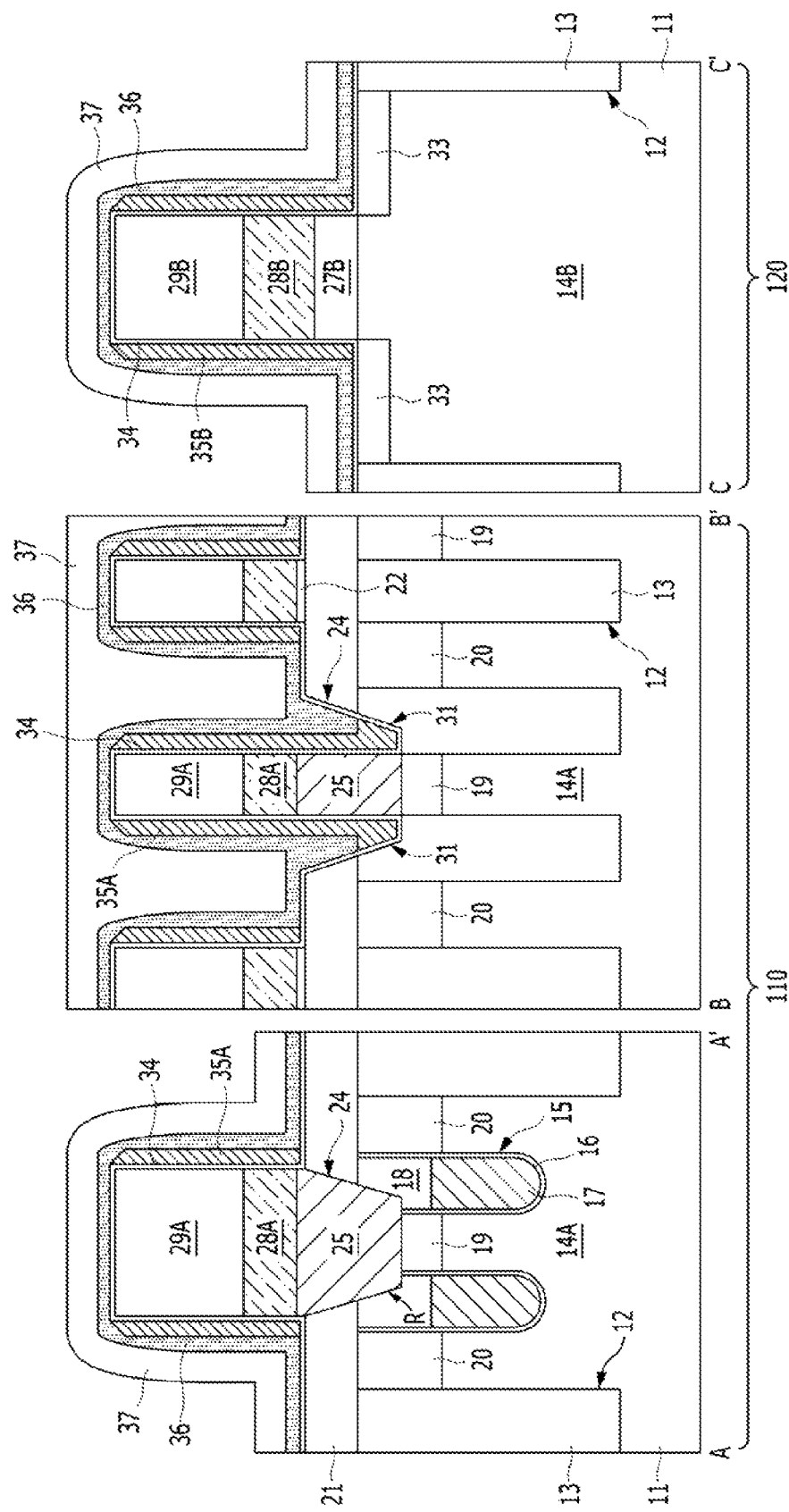

As shown in FIG. 3J, a second spacer layer 36 is formed on the cell sacrificial spacers 35A and the first peripheral sacrificial spacers 35B. The second spacer layer 36 is formed on the entire surface including the cell sacrificial spacers 35A and the first peripheral sacrificial spacers 35B. In particular, the second spacer layer 36 may fill the recessed gaps 35R. The second spacer layer 36 may be formed of a material which has etch selectivity with respect to the cell sacrificial spacers 35A and the first peripheral sacrificial spacers 35B. The second spacer layer 36 may include a dielectric material. The second spacer layer 36 may include silicon oxide or silicon nitride. Hereinafter, the second spacer layer 36 may include silicon nitride.

A second sacrificial spacer layer 37 may be formed on the second spacer layer 36. In the memory cell region 110, the second sacrificial spacer layer 37 may fill the spaces between bit line structures (see the cross-section taken along the line B-B'). In the peripheral circuit region 120, the second sacrificial spacer layer 37 may be conformally formed on the second spacer layer 36.

Figure 3K:
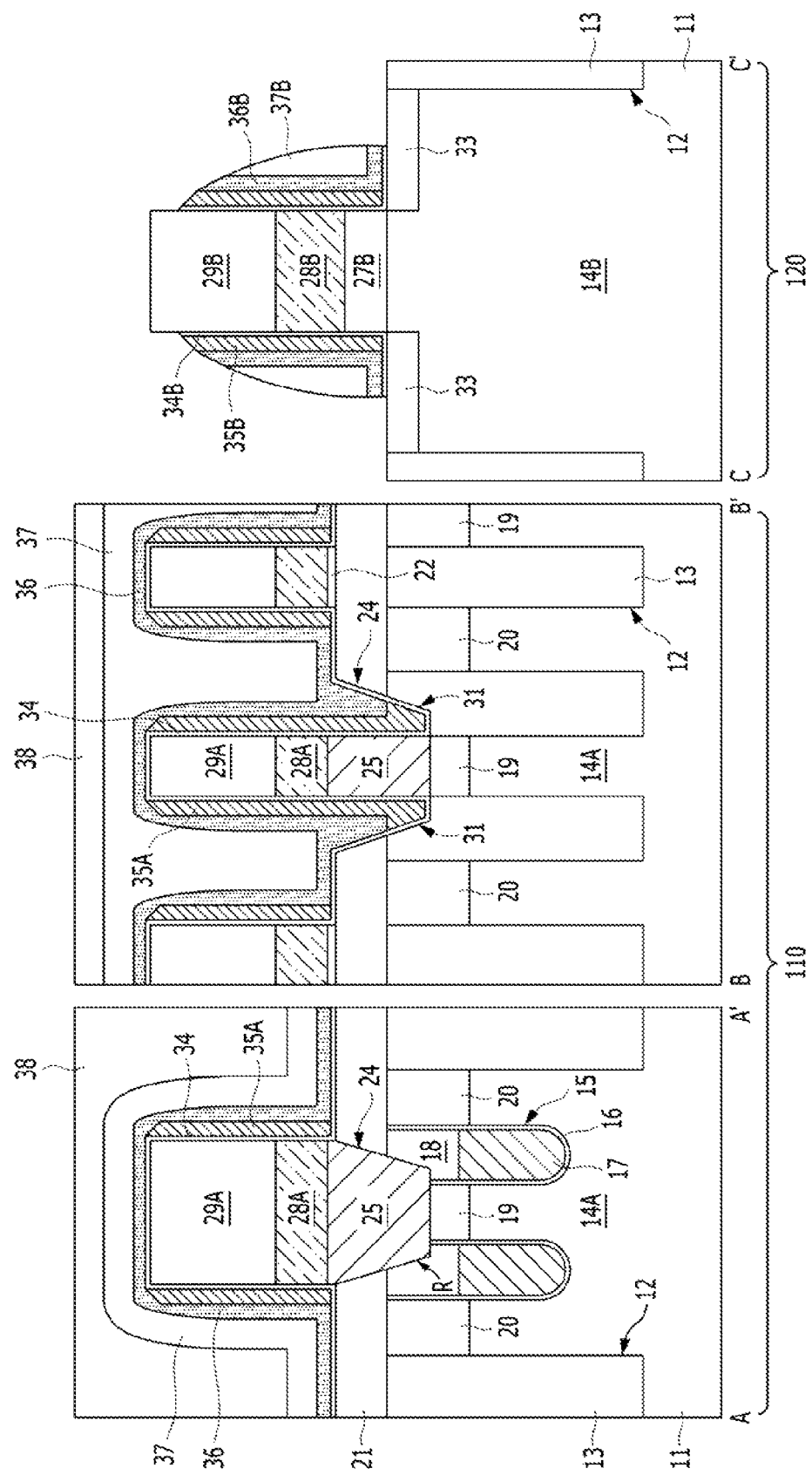

As shown in FIG. 3K, a fifth mask pattern 38 may be formed. The fifth mask pattern 38 may cover the memory cell region 110 and open the peripheral circuit region 120. The second sacrificial spacer layer 37, the second spacer layer 36 and the first spacer layer 34 in the peripheral region are selectively etched by using the fifth mask pattern 38. A gate spacer structure may be formed. The gate spacer structure may include second peripheral sacrificial spacers 37B, second gate spacers 36B, the first peripheral sacrificial spacers 35B, and first gate spacers 34B. The second gate spacers 36B may be formed on the sidewalls of the first peripheral sacrificial spacers 35B, and the second peripheral sacrificial spacers 37B may be formed on the sidewalls of the second gate spacers 36B. The top portions of the second peripheral sacrificial spacers 37B, the second gate spacers 36B, and first gate spacers 34B may be positioned at a level lower than the top surface of the gate hard mask 29B.

As shown in FIG. 3L, the first peripheral sacrificial spacers 35B may be selectively removed by using the fifth mask pattern 38. Spaces created by removing the first peripheral sacrificial spacers 35B form first air gaps 39. The first air gaps 39 may be line shape air gaps which extend in parallel to the sidewalls of the planar gate structure. Wet etching may be applied to remove the first peripheral sacrificial spacers 35B. For example, a chemical capable of selectively removing titanium nitride may be used. Titanium nitride may be removed by a mixture of sulfuric acid ($H_2SO_4$) and hydrogen peroxide ($H_2O_2$). Since titanium nitride is conductive material, the first peripheral sacrificial spacers 35B should be removed entirely. To this end, it is necessary to control a time such that a chemical may be sufficiently flowed inward.

The first air gaps 39 may be positioned between the first gate spacers 34B and the second gate spacers 36B. The bottom portions of the first air gaps 39 may not expose the substrate 11 by the first gate spacers 34B. That is when removing the first peripheral sacrificial spacers 35B, the surface of the substrate 11 may be protected by the first gate spacers 34B.

Figure 3M:
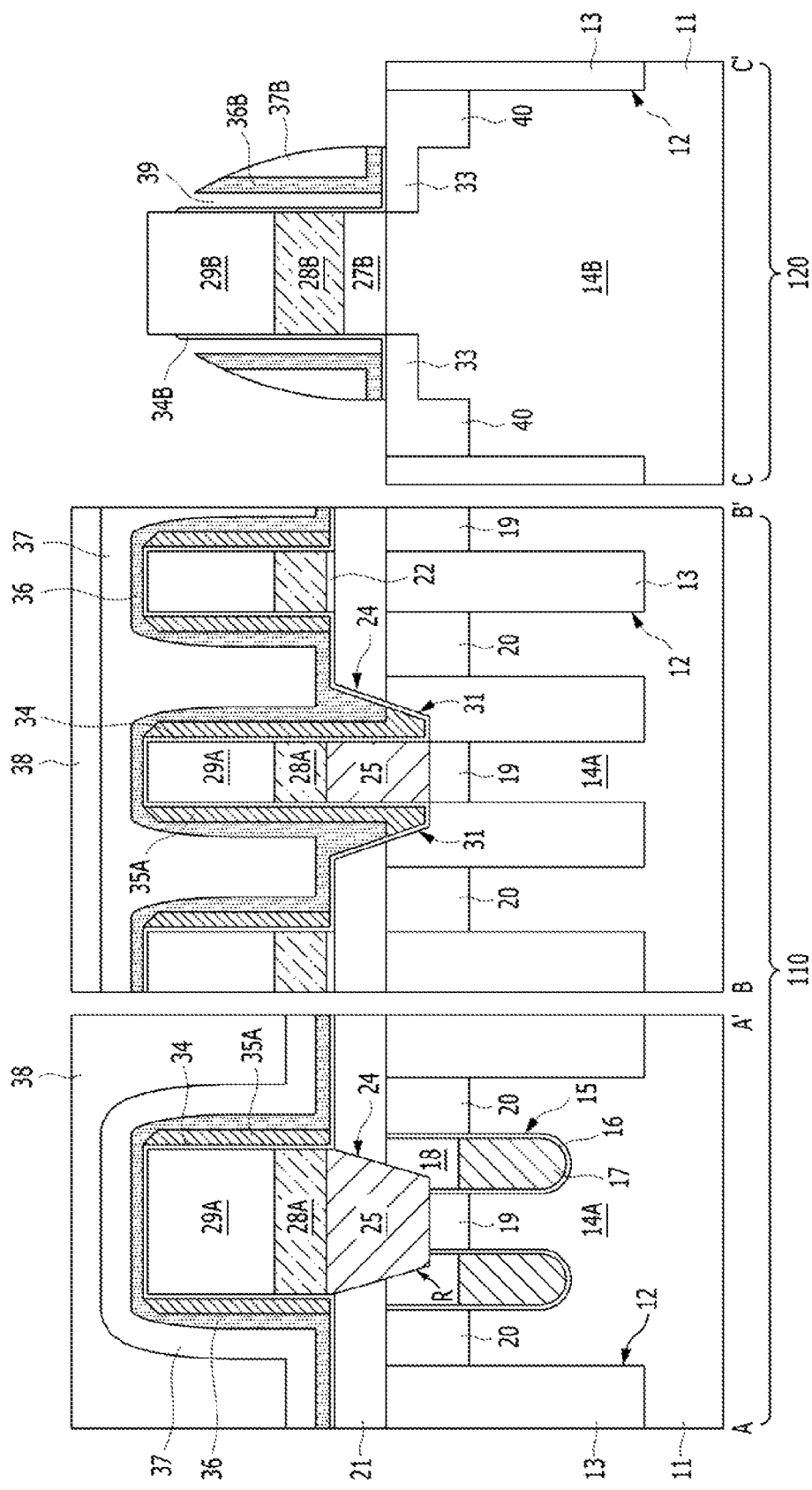

As shown in FIG. 3M, second source/drain regions 40 are formed in the peripheral circuit region 120. The second source/drain regions 40 may include an N-type impurity or a P-type impurity. The second source/drain regions 40 may have a junction depth deeper than the first source/drain regions 33. The second source/drain regions 40 may have a doping concentration higher than the first source/drain regions 33. The second source/drain regions 40 may also be referred to as high concentration source/drain regions.

Figure 3N:
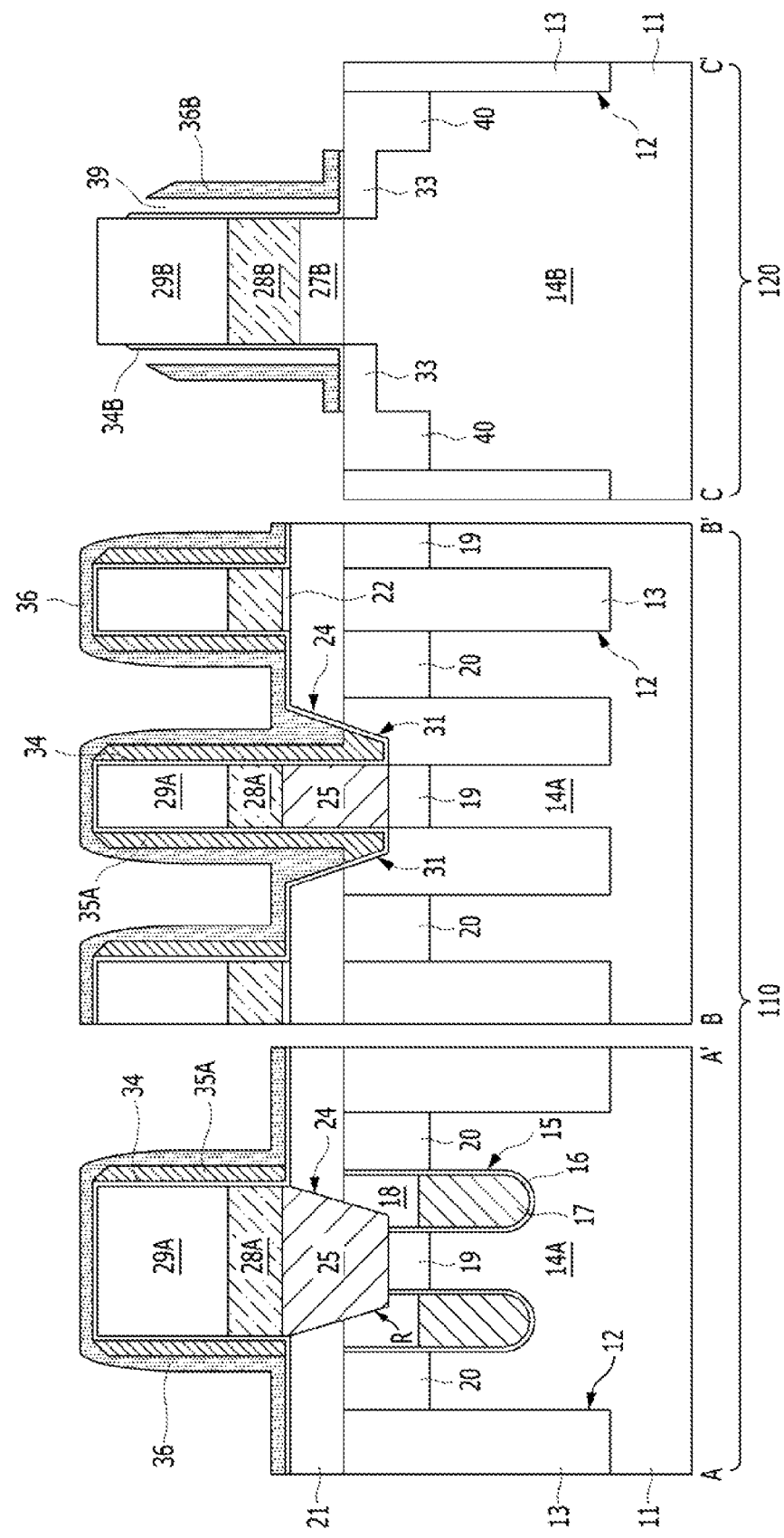
Figure 30:
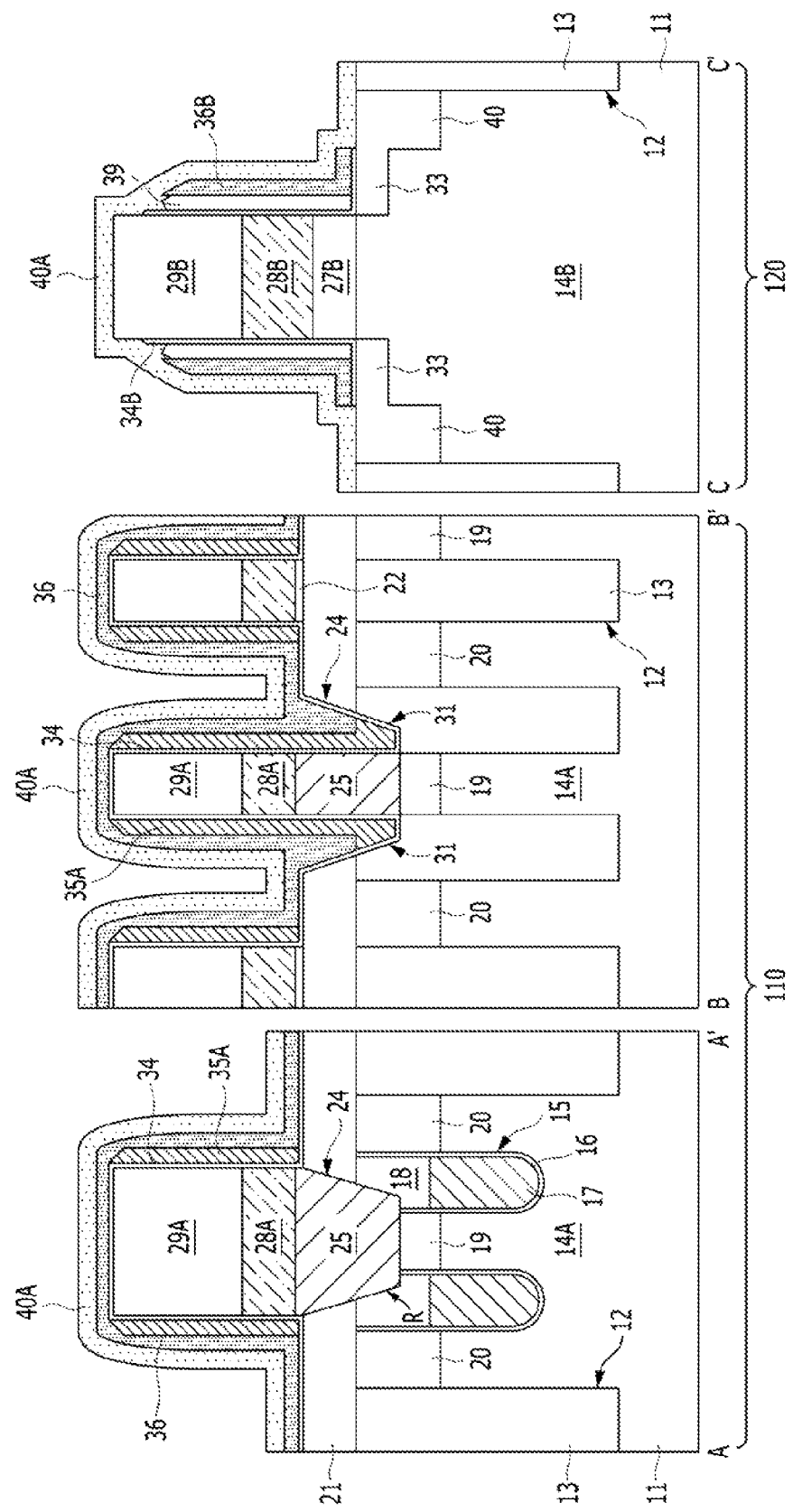

As shown in FIG. 3N, the fifth mask pattern 38 is removed. The second peripheral sacrificial spacers 37B and the second sacrificial spacer layer 37 are removed. In the memory cell region 110, as the second sacrificial spacer layer 37 is removed entirely, the surface of the second spacer layer 36 may be exposed.

As a result, in the peripheral circuit region 120, gate air spacers (GAS) may be formed on the sidewalls of the planar gate structure. The gate air spacer (GAS) may include the first gate spacer 34B, the first air gap 39 and the second gate spacer 36B. Since the first gate spacer 34B and the second gate spacer 36B include silicon nitride, the gate air spacer (GAS) may have a 'nitride-air1-nitride' structure. The gate air spacer (GAS) may have a shape which extends in parallel to the sidewall of the planar gate structure.

As shown in FIG. 3O, a first capping layer 40A may be formed. The first air gaps 39 may be capped by the first capping layer 40k The first capping layer 40A may be formed of a dielectric material. The first capping layer 40A may be formed of silicon oxide. Silicon oxide may be formed by an oxidation process, a deposition process or a combination thereof. For example, after forming first silicon oxide by plasma oxidation, second silicon oxide may be formed by chemical vapor deposition (CVD). In another embodiment, the first capping layer 40A may include silicon nitride or a combination of silicon oxide and silicon nitride. A lower portion of the first capping layer 40A may have enough depth to secure the heights of the first air gaps 39. To form the first capping layer 40A, after depositing silicon nitride on the entire surface to fill the top portions of the first air gaps 39, an etch-back process may be performed. To selectively fill the top portions of the first air gaps 39, silicon nitride may be deposited by a method with poor step coverage. For example, silicon nitride may be deposited by plasma-enhanced chemical vapor deposition (PECVD). Alternatively, two layers of silicon nitride may be formed by using plasma-enhanced chemical vapor deposition (PECVD) and low pressure chemical vapor deposition (LP-CVD). Thus, capping capability may be increased. Since the width of the first air gaps 39 are substantially narrow silicon nitride is not deposited in bottom portions of the first air gaps 39. The top portions of the first air gaps 39 may be positioned at a level lower than the top surface of the gate hard mask 29B by the first capping layer 40A. The first capping layer 40A may be conformally formed on the second spacer layer in the memory cell region 110.

FIGS. 4A to 4K are cross-sectional views describing an example of a method for fabricating a bit line air spacer in accordance with an embodiment.

Figure 4A:
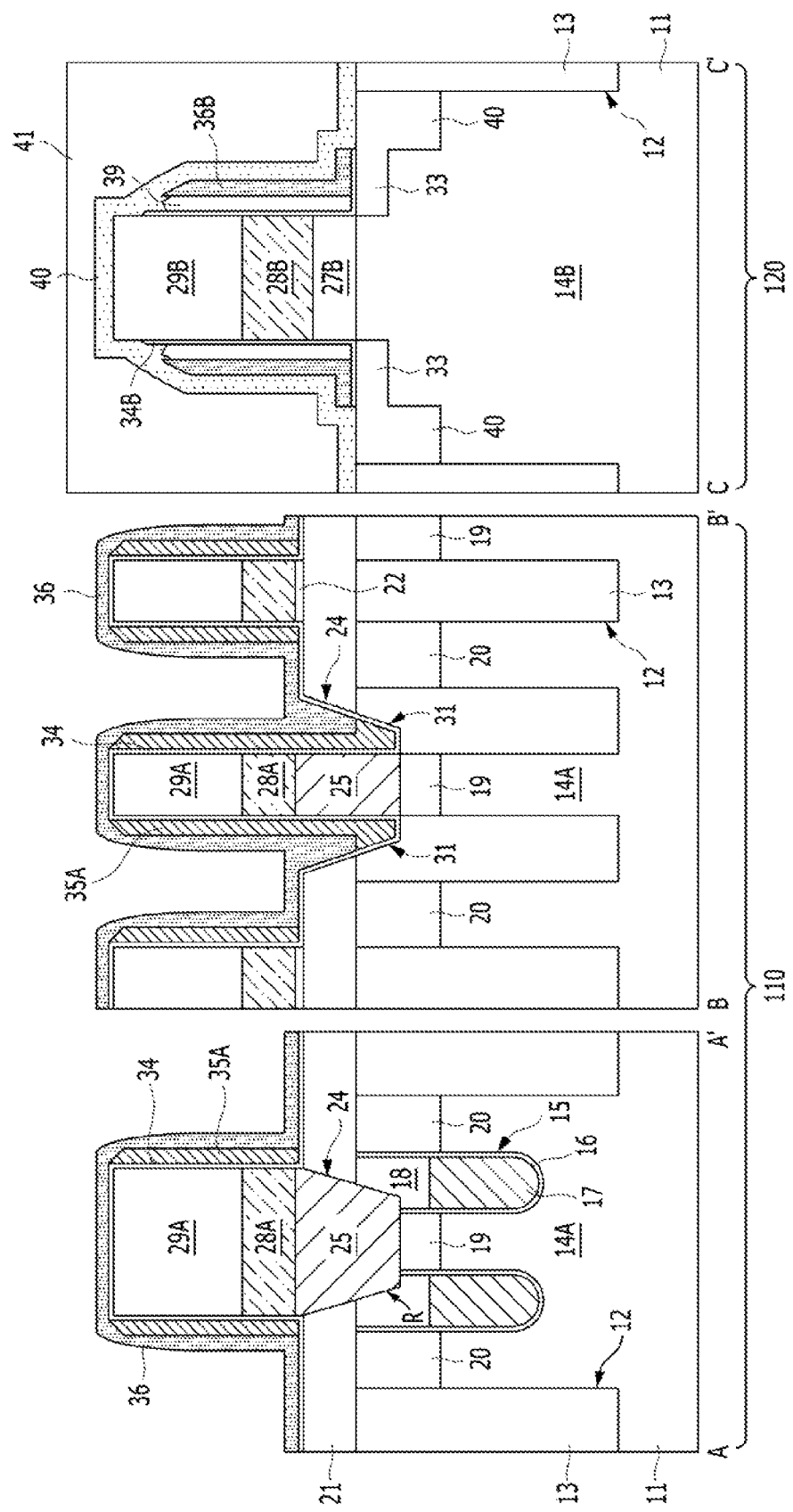
FIGS. 4A to 4K are cross-sectional views describing an example of a method for fabricating a bit line air space in accordance with an embodiment.

As shown in FIG. 4A, a sixth mask pattern 41 is formed. The sixth mask pattern 41 opens the memory cell region 110 but covers the peripheral circuit region 120. By using the sixth mask pattern 41, the first capping layer 40A is removed in the memory cell region 110. A first capping layer 40 may remain in only the peripheral circuit region 120. The second spacer layer 36 may be exposed in the memory cell region 110.

Figure 4B:
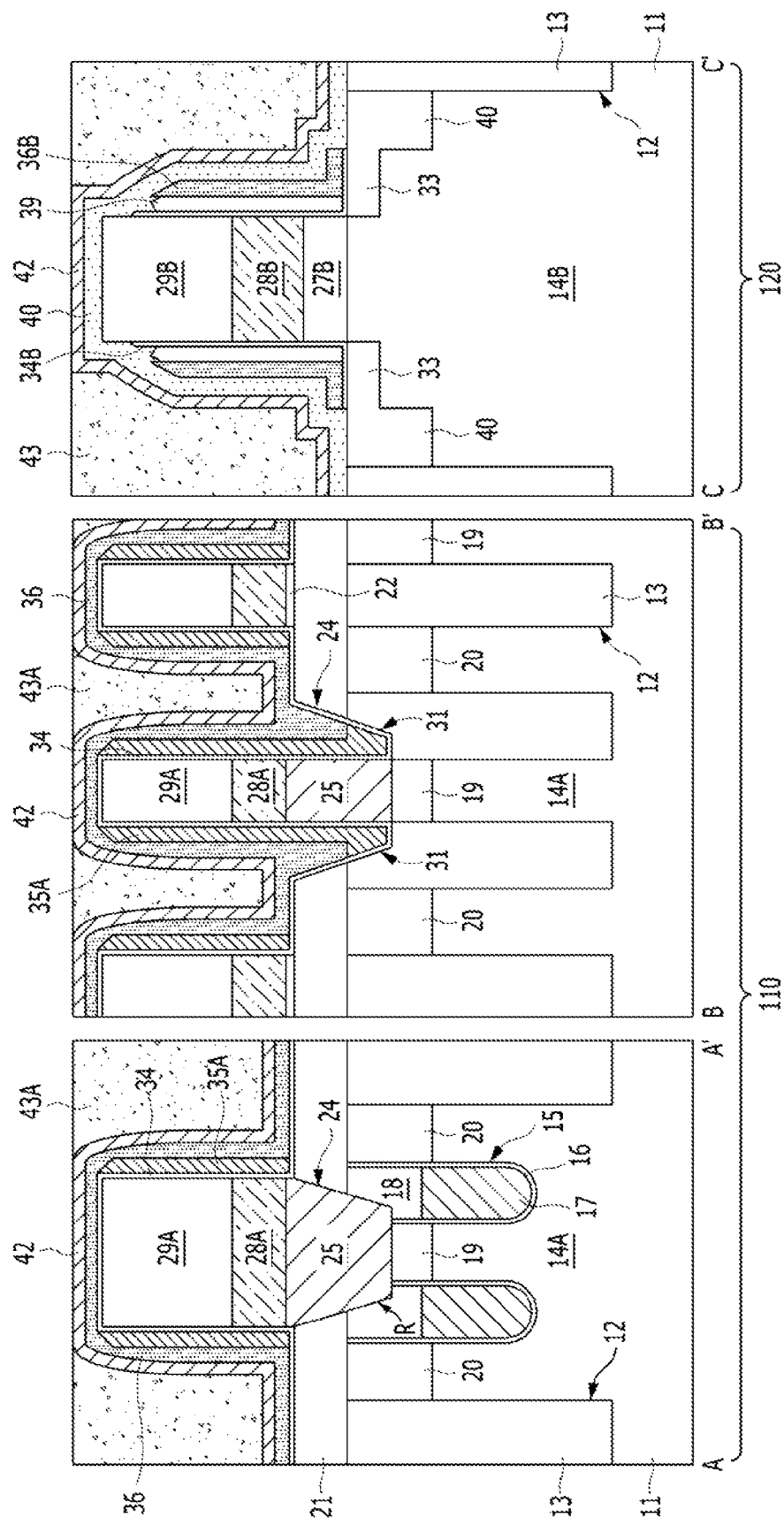

As shown in FIG. 4B, the sixth mask pattern 41 is removed. A third spacer layer 42 may be formed. The third spacer layer 42 may be conformally formed on the first capping layer 40 and the second spacer layer 36. The third spacer layer 42 may be formed of silicon nitride.

A sacrificial layer 43A and a second interlayer dielectric layer 43 are formed. The sacrificial layer 43A may be formed in the memory cell region 110, and the second interlayer dielectric layer 43 may be formed in the peripheral circuit region 120. The sacrificial layer. 43A may fill the spaces between the bit line structures. The second interlayer dielectric layer 43 may cover the top surface of a resultant structure in the peripheral circuit region 120. The sacrificial layer 43A and the second interlayer dielectric layer 43 may be formed of the same material. For example, the second interlayer dielectric layer 43 is formed on the third spacer layer 42 to cover the memory cell region 110 and the peripheral circuit region 120. Subsequently, the second interlayer dielectric layer 43 is planarized. The second interlayer dielectric layer 43 may be formed in the peripheral circuit region 120, and the sacrificial layer 43A may be formed in the memory cell region 110. The second interlayer dielectric layer 43 may also be referred to as a peripheral interlayer dielectric layer. The sacrificial layer 43A and the second interlayer dielectric layer 43 may be formed of a material which has etch selectivity with respect to the third spacer layer 42. The sacrificial layer 43A and the second interlayer dielectric layer 43 include silicon oxide. The sacrificial layer 43A and the second interlayer dielectric layer 43 may include a spin-on-dielectric ("SOD"). The sacrificial layer 43A and the second interlayer dielectric layer 43 may be planarized such that the top surfaces of the bit line structure and the planar gate structure are exposed. The sacrificial layer 43A may extend in parallel to the bit line structure.

In another embodiment, when performing a planarization process for the sacrificial layer 43A, the first spacer layer 34, the second spacer layer 36 and the third spacer layer 42 may be planarized such that the top surface of the bit line hard mask 29A is exposed. When performing a planarization process for the second interlayer dielectric layer 43, the third spacer layer 42 and the first capping layer 40 may be planarized such that the top surface of the gate hard mask 29B is exposed. Etching of the first capping layer 40 may be controlled so that the first air gaps 39 are not exposed.

Figure 4C:
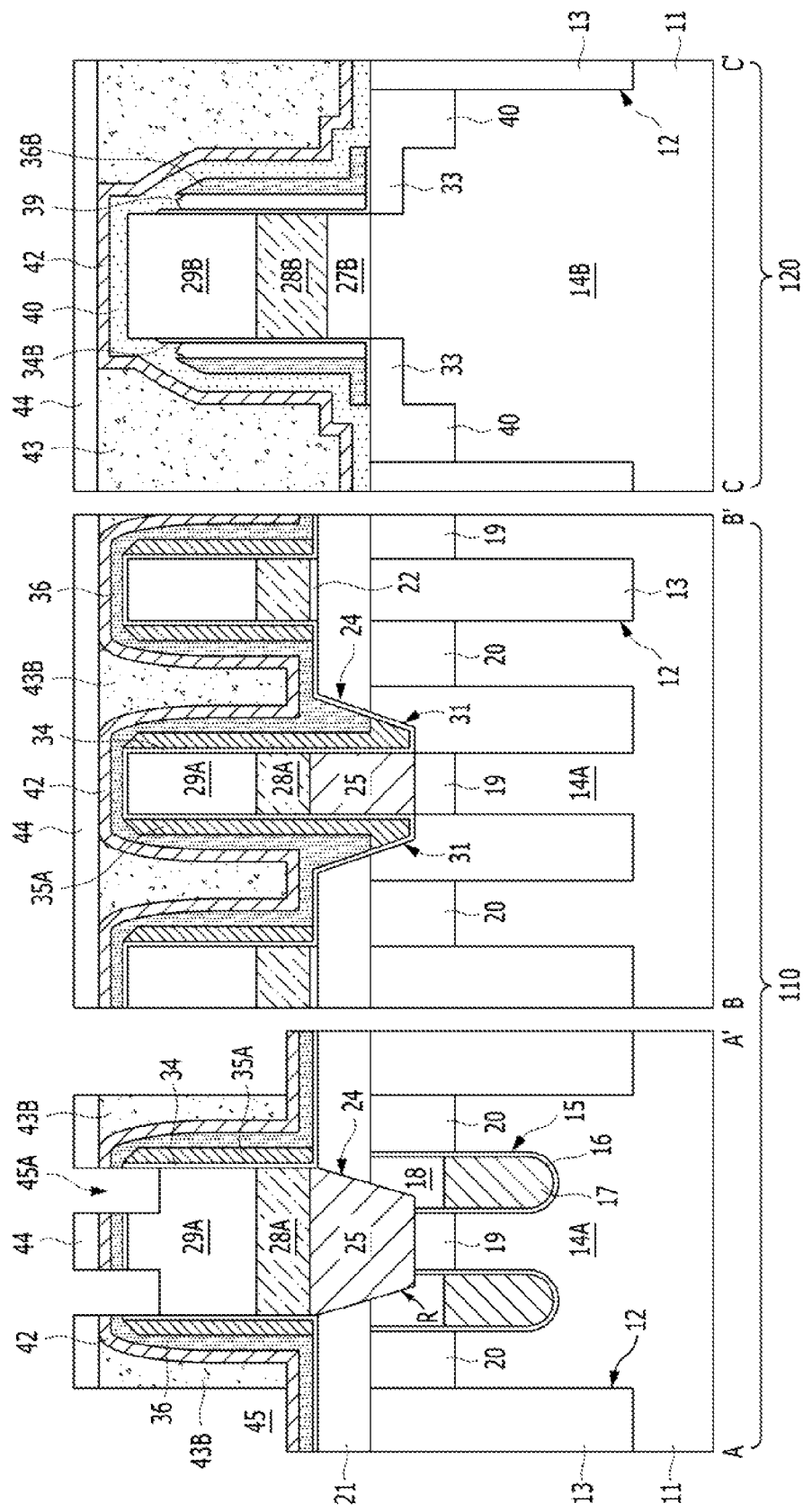

As shown in FIG. 4C, a seventh mask pattern 44 is formed. The seventh mask pattern 44 is patterned in the first direction crossing with the bit, line structure. The seventh mask pattern 44 has a line shape. The seventh mask pattern 44 may include a photoresist pattern. The seventh mask pattern 44 may have the same line width as or a larger line width than the line width of the buried word line 17. When viewed from the top, the seventh mask pattern 44 may have a line shape which overlaps with the buried word line 17. Portions of the third spacer layer 42 may be exposed by the seventh mask pattern 44. A portion of the seventh mask pattern 44 may cover the peripheral circuit region 120.

Pre-isolation parts 45 are formed in the sacrificial layer 43A. The sacrificial layer 43A is etched by using the seventh mask pattern 44 as an etch mask. The pre-isolation parts 45 are formed, and sacrificial layer patterns 43B remain between the pre-isolation parts 45.

When etching the sacrificial layer 43A, portions of the third spacer layer 42, the second spacer layer 36, the first spacer layer 34 and the bit line hard mask 29A may be etched. The pre-isolation parts 45 may have a line shape which crosses the bit line structure. Portions 45A of the pre-isolation parts 45 may be positioned in the bit line hard mask 29A and extend to a predetermined depth. The portions 45A of the pre-isolation parts 45 may not expose the bit line 28A. The portions 45A of the pre-isolation parts 45 may overlap with the buried word lines 17. In another embodiment, the portions 45A of the pre-isolation parts 45 may have a line width smaller than the buried word lines 17.

Figure 4D:
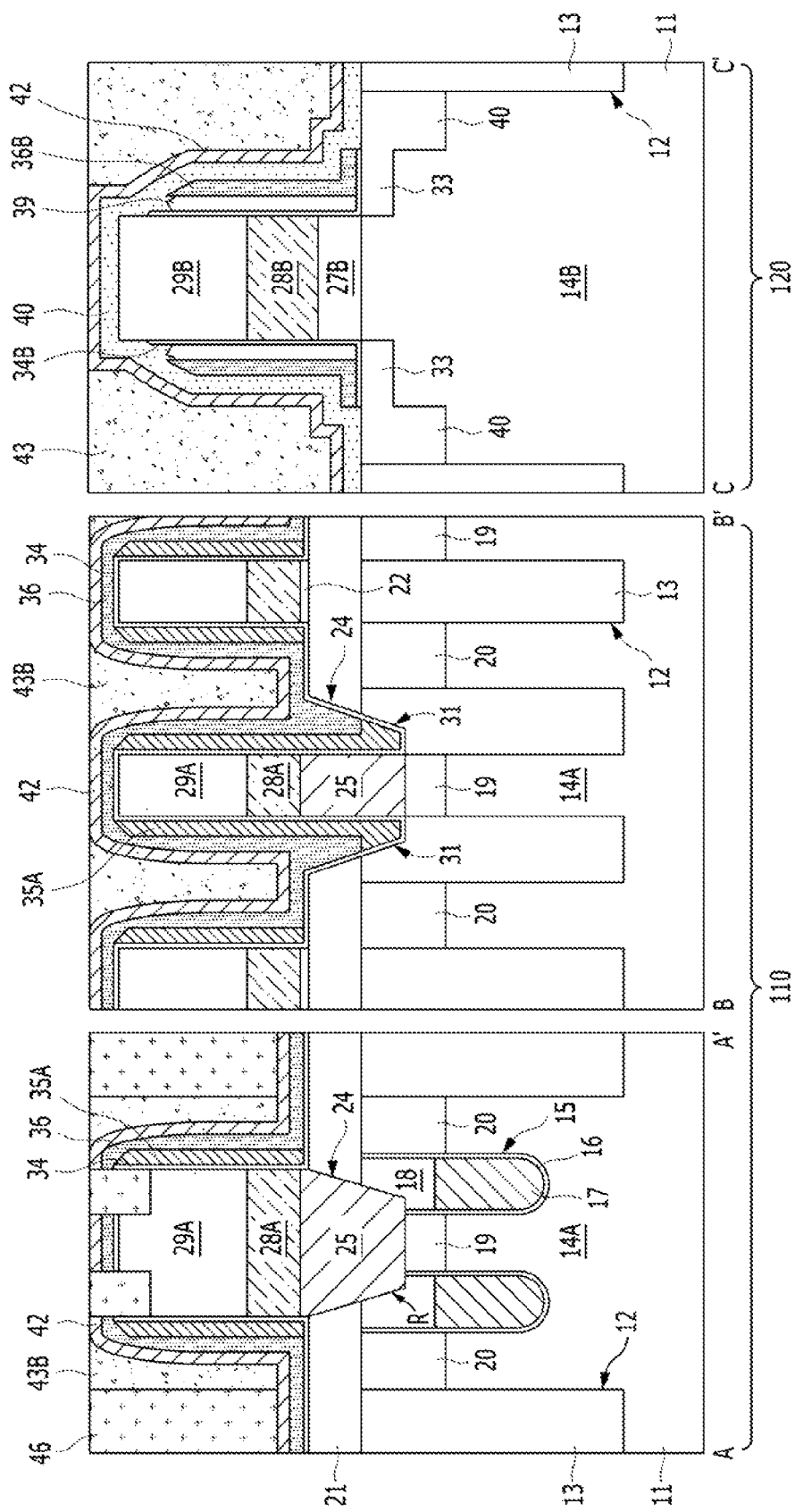

As shown in FIG. 4D, the seventh mask pattern 44 is removed. A plug isolation layer 46 is formed in the pre-isolation parts 45. The plug isolation layer 46 may be formed by silicon nitride filling the pre-isolation parts 45 and planarizing the silicon nitride. The plug isolation layer 46 has a line shape which extends in a direction crossing the bit line structure. The sacrificial layer patterns 43B remain in spaces in which the plug isolation layer 46 and the bit line structure cross each other. The plug isolation layer 46 may fill the pre-isolation parts 45 and the portions 45A of the pre-isolation parts 45.

Figure 4E:
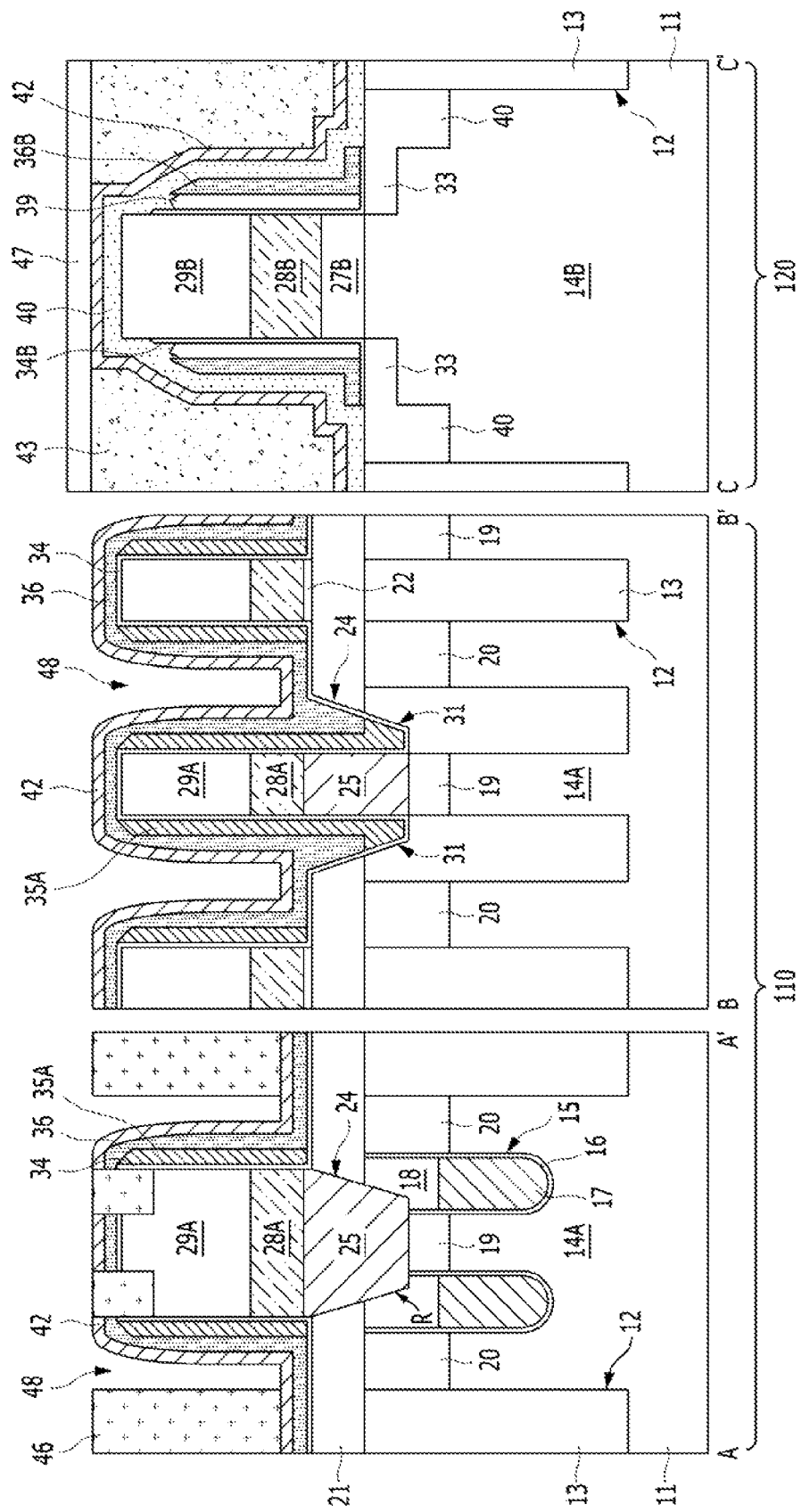

As shown in FIG. 4E, an eighth mask pattern 47 is formed. The eighth mask pattern 47 opens the memory cell region 110 but covers the peripheral circuit region 120. The eighth mask pattern 47 may include a photoresist pattern.

The sacrificial layer patterns 43B are removed. The spaces from which the sacrificial layer patterns 43B are removed become second openings 48. The second opening 48 is formed between portions of the plug isolation layer 46. The second opening 48 is arranged with a shape which is isolated by the bit line structure and the plug isolation layer 46. To remove the sacrificial layer patterns 43B, dip-out may be applied. By dip-out, the sacrificial layer patterns 43B may be selectively removed without loss of the first spacer layer 34, cell sacrificial spacers 35A and the second spacer layer 36. When viewed from the top, the second opening 48 may have a quadrangular hole shape. The second openings 48 may be positioned on both sides of the bit line structure. Neighboring second openings 48 may be isolated by the plug isolation layer 46.

Figure 4F:
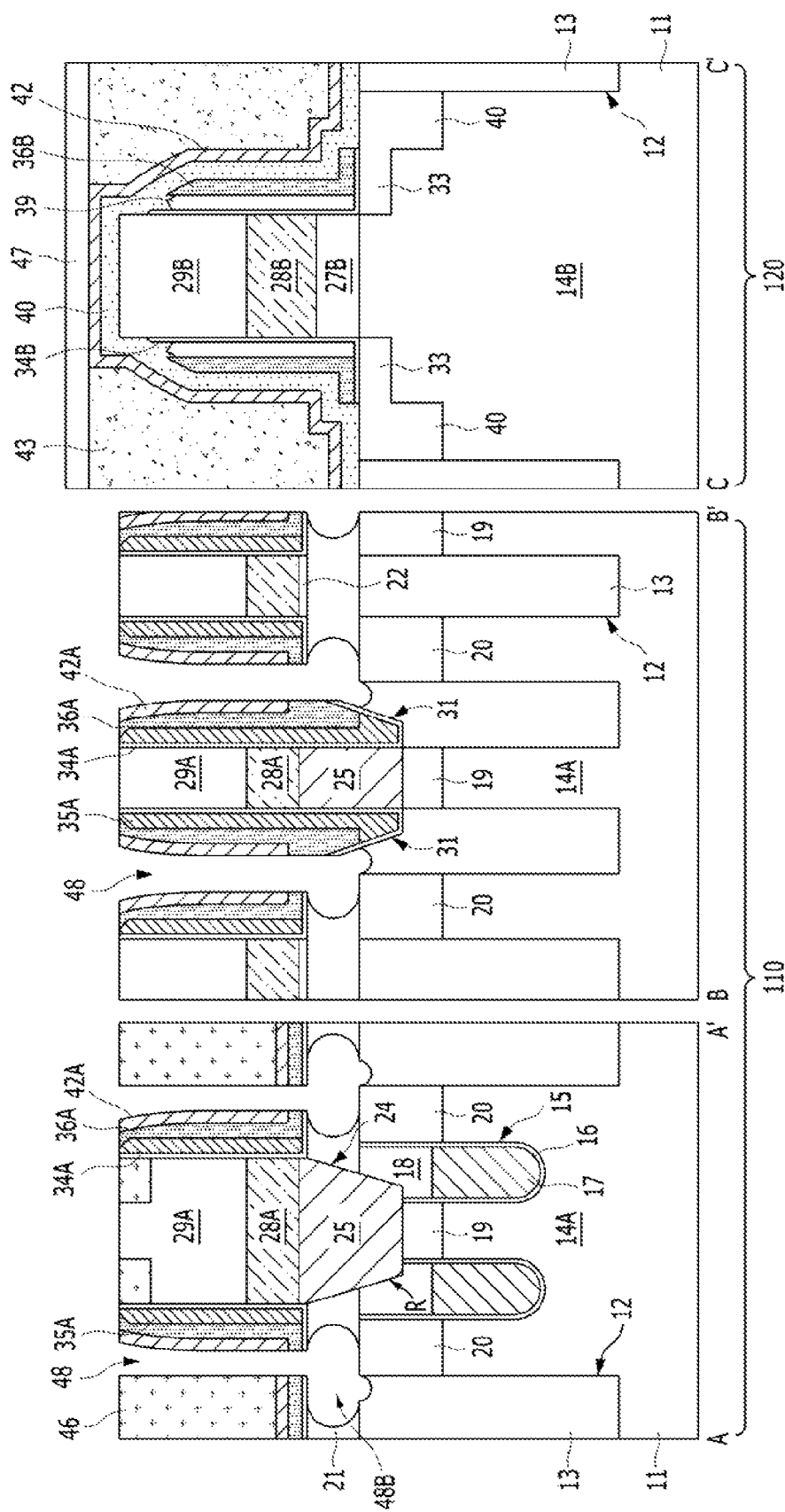

As shown in FIG. 4F, a trimming process may be performed. By the trimming process, lateral widening and downward widening of the second opening 48 may be implemented. By performing the trimming process, a space is formed. A second plug and a third plug are subsequently formed in the space. Thus, the second opening 48 may be sufficiently secured. By the trimming process, the third spacer layer 42, the second spacer layer 36 and the first spacer layer 34 may be removed from the surface of the first interlayer dielectric layer 21. Accordingly, first spacers 34A, second spacers 36A and third spacers 42A may be formed on the sidewalls of the bit line 28k The third spacers 42A are formed by etching the third spacer layer 42. By etching the second spacer layer 36 and the first spacer layer 34 in a manner self-aligned with the sidewalls of the third spacers 42A, the second spacers 36A and the first spacers 34A are formed. The third spacer layer 42 remaining in the peripheral circuit region 120 may also be referred to as a capping strengthening layer 42. By the capping strengthening layer 42, the first air gaps 39 may be protected from a subsequent process.

The second openings 48 are widened downward. To this end, the first interlayer dielectric layer 21 is etched in a manner self-aligned with the sidewalls of the third spacers 42A. The first interlayer dielectric layer 21 may be etched by dry etching. For example, the first interlayer dielectric layer 21 may be etched through isotropic etching. The second impurity regions 20 are exposed under the second openings 48. Subsequently, portions of the second impurity regions 20 and the isolation layer 13 may be recessed to a predetermined depth. The bottom surfaces of the second openings 48 may have a V-shaped profile due to a difference in etching selectivity. Further, bottom portions 48B of the second openings 48 may be laterally widened by the isotropic etching and have a bulb shape. Isotropic etching may be controlled not to expose the sidewalls of the first plug 25 by the bottom portions 48B of the second openings 48.

After widening the second openings 48, bit line spacers may be formed on the sidewalls of the bit line 28k The bit line spacers may include the first spacers 34A, the cell sacrificial spacers 35A, the second spacers 36A, and the third spacers 42A. The bit line spacers may extend in parallel to the sidewalls of the bit line 28k The top portions of the cell sacrificial spacers 35A are exposed. Portions of the bit line spacers may extend onto the sidewalls of the first plug 25. The first spacers 34A, the cell sacrificial spacers 35A and the second spacers 36A may be formed on the sidewalls of the first plug 25. The first spacers 34A, the cell sacrificial spacers 35A and the second spacers 36A may be filled in the gaps 31. The bottom portions of the cell sacrificial spacers 35A may be closed by the first spacers 34A and the second spacers 36A. The first spacers 34A and the second spacers 36A may contact each other on the sidewalls of the first plug 25.

The first spacers 34A, the second spacers 36A and the third spacers 42A may include silicon nitride. The cell sacrificial spacers 35A may include titanium nitride. Accordingly, the bit line spacers of a nitride-TiN-nitride-nitride (N—TiN—N—N) structure may be formed on the sidewalls of the bit line 28A. The bit line spacers of a nitride-TiN-nitride (N—TiN—N) structure may be formed on the sidewalls of the first plug 25.

Figure 4G:
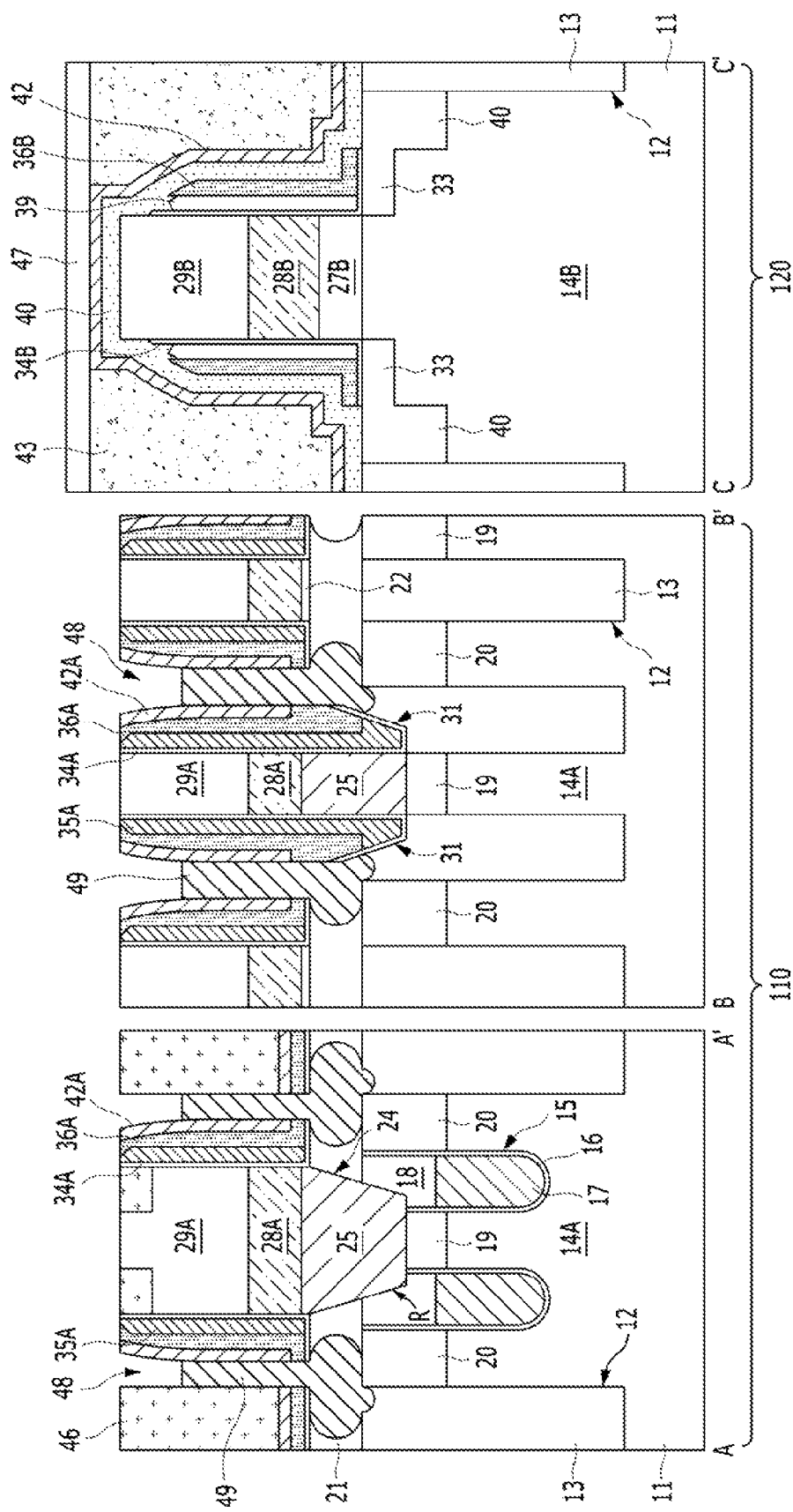

As shown in FIG. 4G, second plugs 49 are formed. The second plugs 49 are formed in the second openings 48. The second plugs 49 may include a silicon-containing layer. The second plugs 49 may include a polysilicon layer. The polysilicon layer may be doped with an impurity. The second plugs 49 are coupled with the second impurity regions 20. The top surfaces of the second plugs 49 may be positioned at a level higher than the top surface of the bit line 28A and lower than the top surface of the bit line hard mask 29A. The second plugs 49 may also be referred to as recessed plugs. To form the second plugs 49, after depositing a polysilicon layer, planarization and etch-back may be sequentially performed. While forming the second plugs 49, the peripheral circuit region 120 may be protected by the eighth mask pattern 47.

The first plug 25 and the bit line 28A may be located close to the second plugs 49. The bit line spacers are interposed between the first plug 25 and the bit line 28A. The bit lines spacers including the first spacers 34A, the cell sacrificial spacers 35A, the second spacers 36A and the third spacers 42A may be formed between the bit line 28A and the second plugs 49. Furthermore, the bit line spacers including the first spacers 34A, the cell sacrificial spacers 35A and the second spacers 36A may be formed between the first plug 25 and the second plugs 49. As a result, the cell sacrificial spacers 35A may be positioned between the first plug 25 and the second plugs 49 and may vertically extend to be positioned between the bit line 28A and the second plugs 49.

Figure 4H:
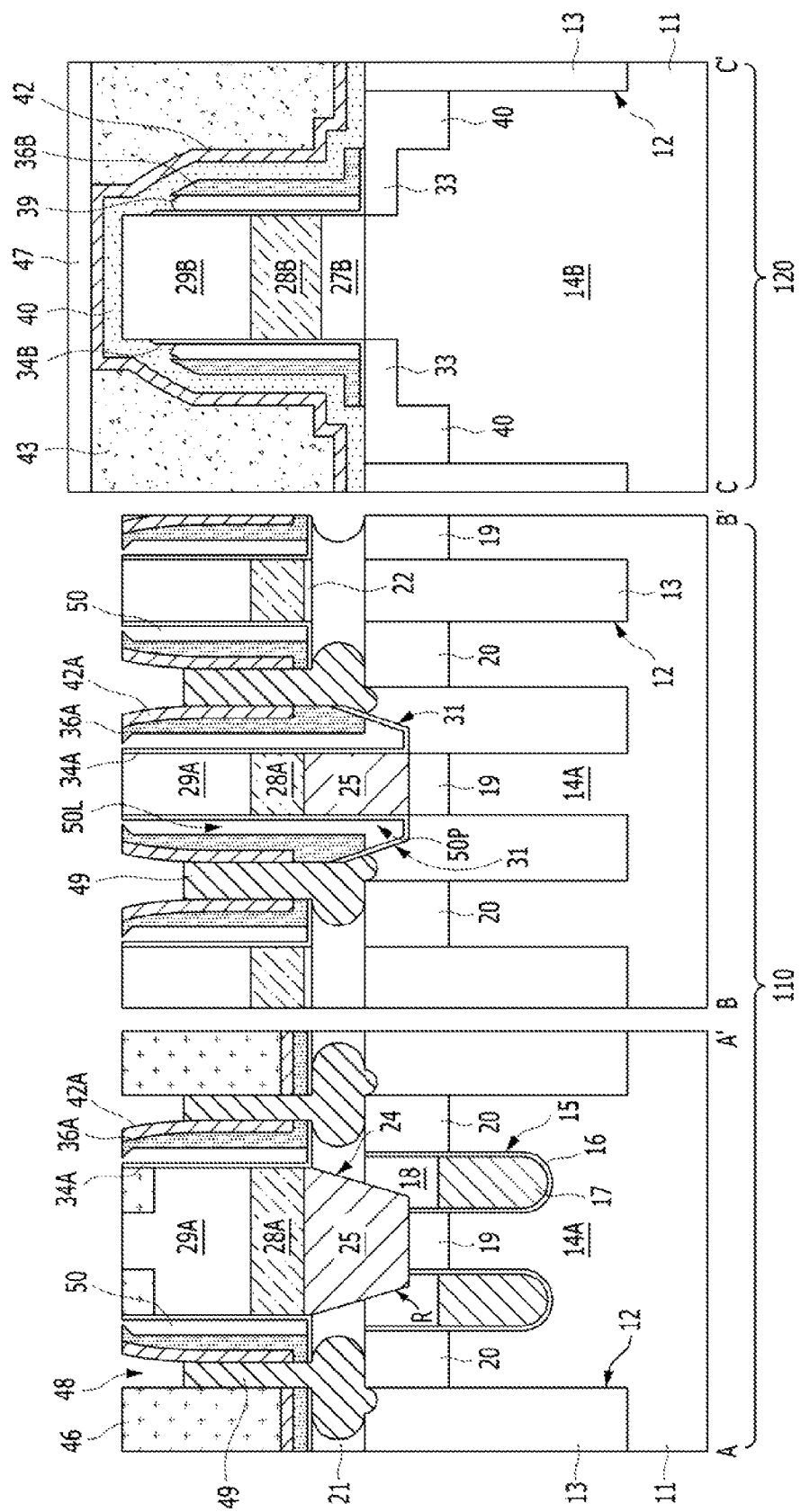

As shown in FIG. 4H, the cell sacrificial spacers 35A are removed. Accordingly, spaces from which the cell sacrificial spacers 35A are removed remain as second air gaps 50. To remove the cell sacrificial spacers 35A, wet etching may be applied. For example, a chemical capable of selectively removing titanium nitride may be used. Titanium nitride may be removed by a mixture of sulfuric acid ($H_2SO_4$) and hydrogen peroxide ($H_2O_2$). Since titanium nitride is a conductive layer, the cell sacrificial spacers 35A should be removed entirely. To this end, it is necessary to control the process time such that a chemical may be sufficiently flowed inward around the first plug 25. Since the first spacers 34A and the second spacers 36A have etch selectivity with respect to the chemical, the bit line 28A, the first plug 25 and the second plugs 49 are protected while removing the cell sacrificial spacers 35A.

The second air gaps 50 may also be referred to as full air gaps. That is, the second air gaps 50 may be formed between the bit line 28A and the second plugs 49, and, at the same time, may be formed between the first plug 25 and the second plugs 49. The second air gaps 50 include line shape air gaps 50L and plug type air gaps 50P. The line shape air gaps 50L extend in parallel to the bit line 28A. The plug type air gaps 50P are formed on the sidewalk of the first plug 25. The line shape air gaps 50L and the plug type air gap 50P, are coupled to each other. The plug type air gaps 50P are independently formed on both sidewalls of the first plug 25.

As described above, the second air gaps 50 including the line shape air gaps 50L and the plug type air gaps 50P are formed. Bit line air spacers (BAS) including the first spacers 34A, the line shape air gaps 50L, the second spacers 36A and the third spacers 42A are formed on the sidewalls of the bit line structure. Air plugs (AP) including the first spacers 34A, the plug type air gaps 50P and the second spacers 36A are formed on the sidewalk of the first plug 25. Since the first spacers 34A, the second spacers 36A and the third spacers 42A include silicon nitride, the bit line air spacers have an 'N-air-N—N (NANN)' structure. Since the first spacers 34A and the second spacers 36A include silicon nitride, the air plugs have an 'N-air-N(NAN)' structure. The bottom portions of the plug type air gaps 50P are enclosed and not exposed to outside. Thus the plug type air gaps 50P and the second plugs 49 are prevented from being short-circuited. The top portions of the line shape air gaps 50L are exposed to outside.

Figure 4I:
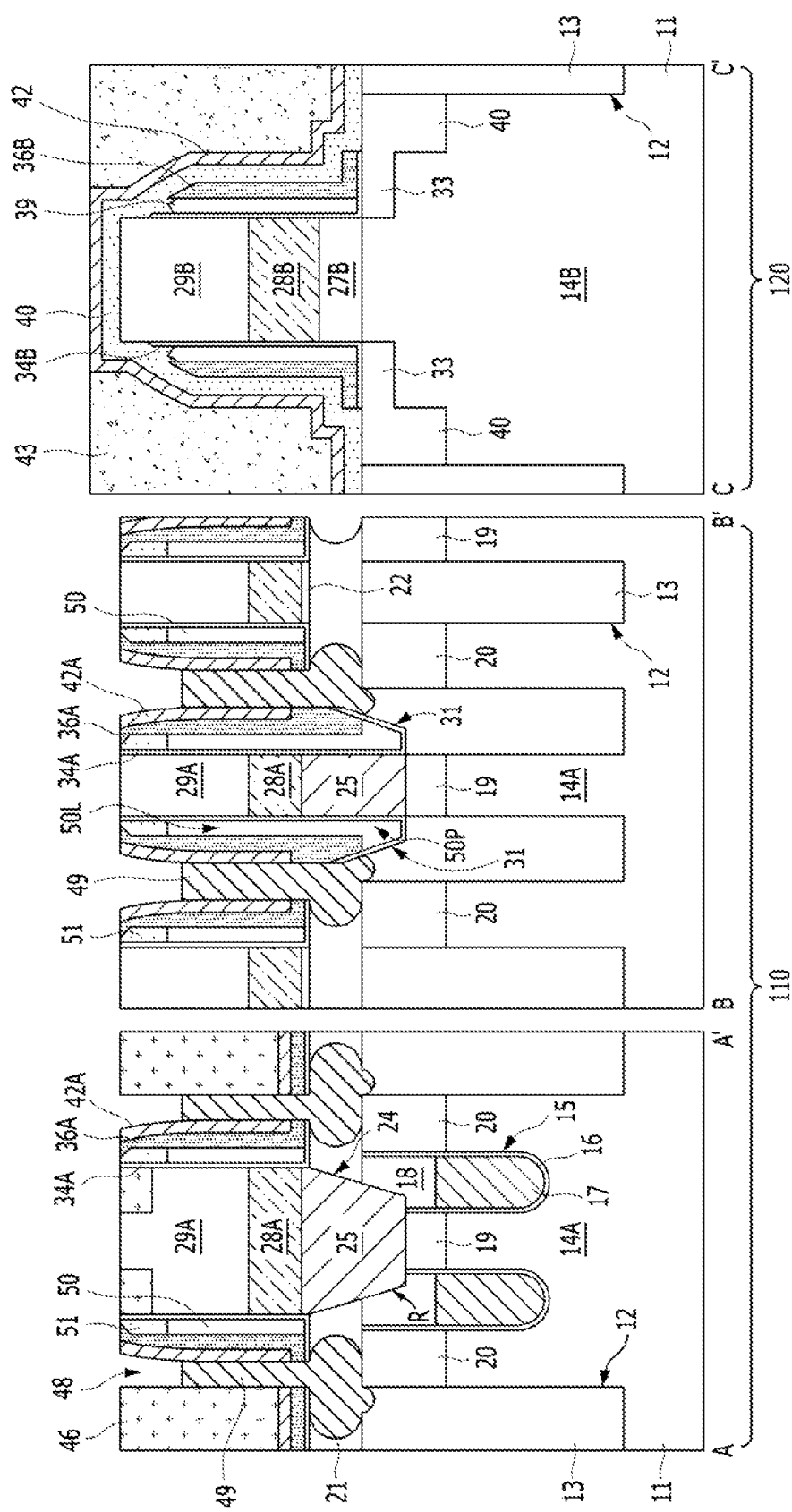

As shown in FIG. 4I, a second capping layer 51 is formed. The second capping layer 51 fills the top portions of the second air gaps 50. The second capping layer 51 may include silicon oxide, silicon nitride or a combination thereof. The bottom portions of the second capping layer 51 may extend to such a level that the second air gaps 50 remain between the bit line 28A and the second plugs 49. To form the second capping layer 51, after depositing silicon nitride on the entire surface to fill the top portions of the second air gaps 50, etch-back may be performed. Although not shown, while forming the second capping layer 51, a capping layer may also be formed on the sidewalls of the third spacers 42A on the second plugs 49. To selectively fill only the top portions of the second air gaps 50, silicon nitride may be deposited by a method with poor step coverage. For example, silicon nitride may be deposited by plasma-enhanced chemical vapor deposition (PECVD). Since the width of the second air gaps 50 is substantially narrow, silicon nitride is not deposited to the bottom portions of the second air gaps 50.

In another embodiment, the following method may be used to form the second capping layer 51. First, after forming silicon oxide by an oxidation process to cover the top surfaces and the top corners of the second plugs 49, first silicon nitride is conformally formed. Next by etching back first silicon nitride and silicon oxide, the top surfaces of the second plugs 49 may be exposed. Then, after forming second silicon nitride, etch-back is performed. The second capping layer 51 may have a three-layered structure of silicon oxide, first silicon nitride, and second silicon nitride. To maximize the exposure area of the top surface of the second plug 49, the thickness of the second capping layer 51 may be controlled. The eighth mask pattern 47 may be removed.

Figure 4J:
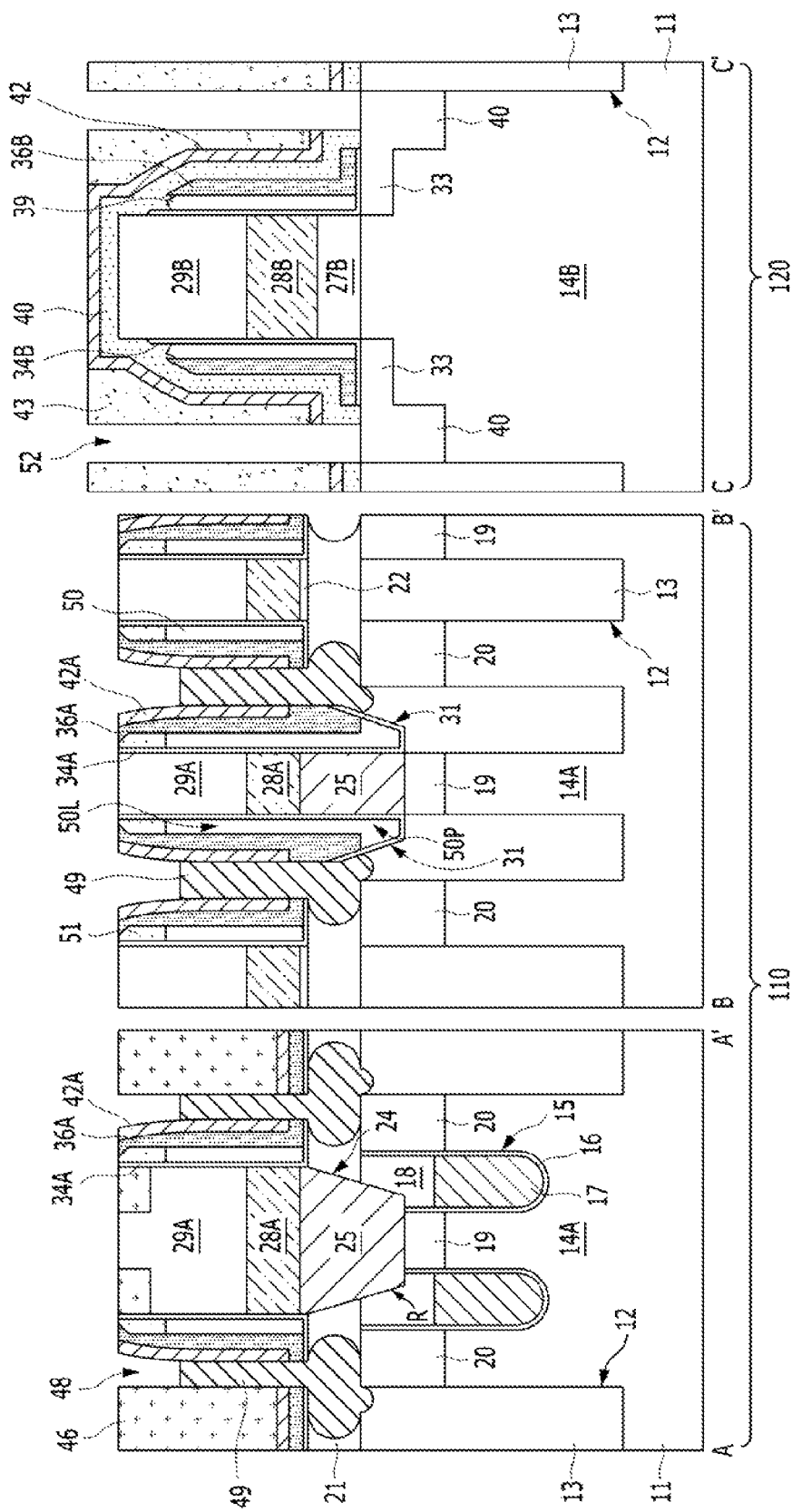

As shown in FIG. 4J, contact holes 52 may be formed in the peripheral circuit region 120. To form the contact holes 52, a contact mask pattern (not shown) may be formed. The contact mask pattern may cover the memory cell region 110. By using the contact mask pattern as an etch mask, the second interlayer dielectric layer 43, the capping strengthening layer 42 and the first capping layer 40 are etched. The contact holes 52 which expose the surfaces of the second source/drain regions 40 may be formed.

Figure 4K:
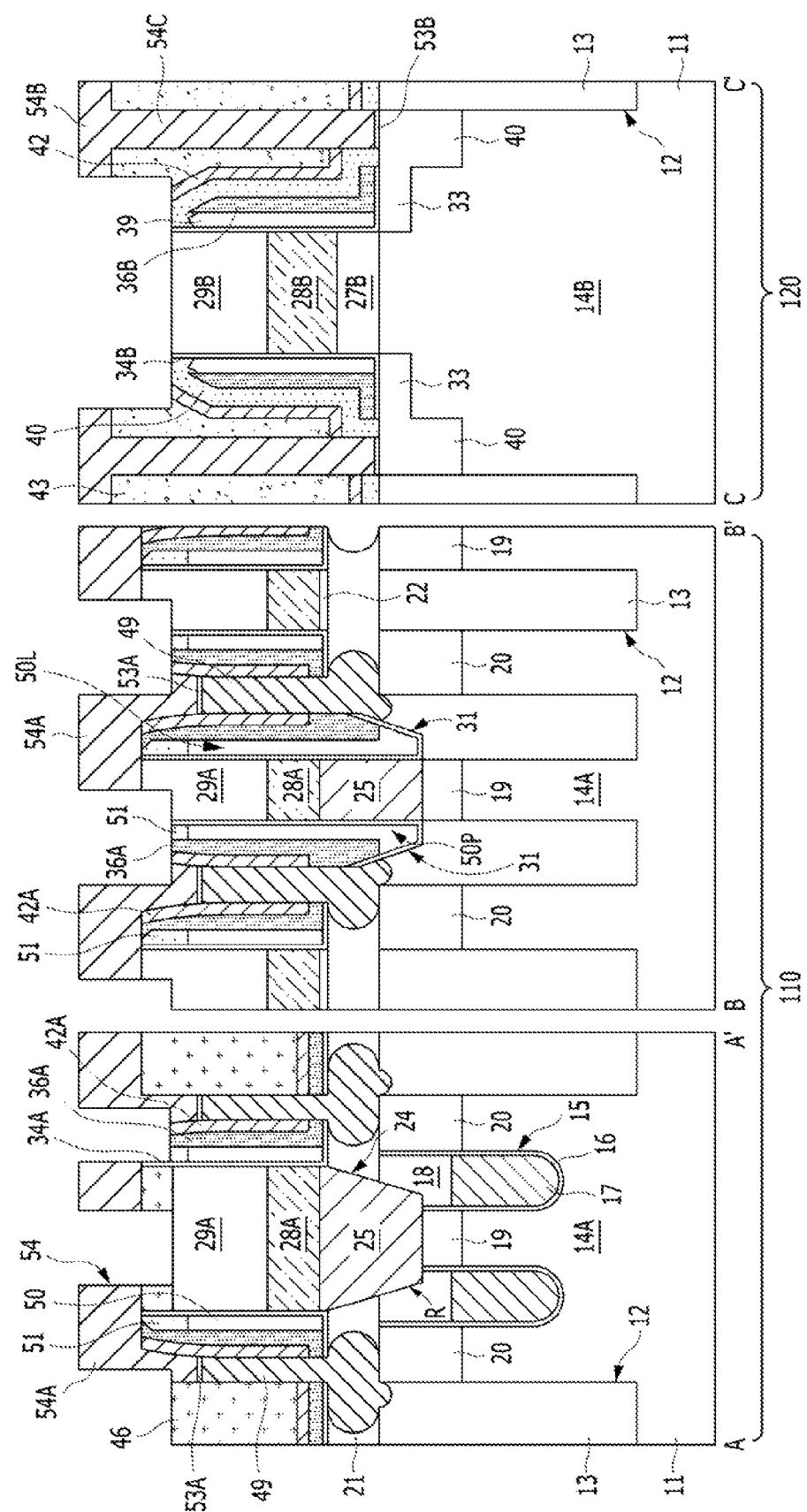

As shown in FIG. 4K, an ohmic contact layer 53A is formed on the second plugs 49. The ohmic contact layer 53A may include a metal silicide. To form the ohmic contact layer 53A, deposition and annealing of a silicidable metal layer are performed. As silicidation occurs at an interface where the silicidable metal layer and the second plugs 49 contact each other, a metal silicide layer is formed. The ohmic contact layer 53A may include cobalt silicide, an embodiment, the ohmic contact layer 53A may include cobalt silicide of a "$CoSi_2$ phase". When cobalt silicide of a "$CoSi_2$ phase" is formed as the ohmic contact layer 53A, contact resistance may be improved and cobalt silicide of low resistance may be formed.

An ohmic contact layer 53B may be simultaneously formed in the peripheral circuit region 120. For example, the ohmic contact layer 53B may be formed on the surfaces of the second source/drain regions 40. The ohmic contact layer 53B may include cobalt silicide of a "$CoSi_2$ phase".

Third plugs 54A are formed on the ohmic contact layer 53A. The third plugs 54A are formed on the ohmic contact layer 53A and fill in the remainder of the second openings 48. The third plugs 54A may include a metal-containing layer. The third plugs 54A may include a tungsten-containing material. The third plugs 54 may include a tungsten layer or a tungsten compound. For example after depositing a tungsten layer on the ohmic contact layer 53A to fill the remainder of the second openings 48, the tungsten layer is etched. The third plugs 54A may be formed. The third plug 54A may have an extended part 54 which partially overlaps the bit line structure. Thus, an overlay margin with respect to a memory element to be subsequently formed, may be secured.

As an etching process for forming the third plugs 54A includes over-etching, the first spacers 34A, the second spacers 36A, the second capping layer 51 and the bit line hard mask 29A may be partially etched in a manner self-aligned with the edges of the third plugs 54A. The etching of the second capping layer 51 is controlled such that the second air gaps 50 are not exposed.

While forming the third plugs 54A, metal contact plugs 54C and metal lines 54B may be formed in the peripheral circuit region 120. The metal contact plugs 54C may fill the contact holes 52. The top surfaces of the metal lines 54B may be positioned at the same level as the third plugs 54A. The metal lines 54B and the metal contact plugs 54C may be integrated to form a single body. The metal lines 54B may be coupled to the second source/drain regions 40 through the metal contact plugs 54C. In another embodiment, after first forming the metal contact plugs 54C, the metal lines 54B and the third plugs 54A may be formed. Subsequently, while not shown, memory elements may be formed on the third plugs 54A (see FIG. 2A).

According to the above-described embodiment, by forming the line shape air gaps 50L between the second plugs 49 and the bit line 28A, the parasitic capacitance between the bit line 28A and the second plug 49 may be reduced. Also, by forming the plug type air gaps 50P between the first plug 25 and the second plugs 49, the parasitic capacitance between the first plug 25 and the second plug 49 may be reduced. Moreover, by forming the first air gaps 39 on the sidewalls of the planar gate electrode 28B, the parasitic capacitance between the planar gate electrode 28B and the metal contact plug 54C may be reduced.

Further, the first air gaps 39 may be protected by the first capping layer 40 and the capping strengthening layer 42. For example, even though over-etching occurs in the etching process for forming the metal lines 54B, the first air gaps 39 are not exposed and protected by the first capping layer 40 and the capping strengthening layer 42. When the first air gaps 39 are capped by the first capping layer 40 and the capping strengthening layer 42 the first air gaps 39 may be stably protected. When the first air gaps 39 are capped by solely the first capping layer 40, the first air gaps 39 may not be stably protected. As a result, the sensing margin of a memory cell may be improved, and the operation speed of a peripheral transistor may be increased.

Figure 5:
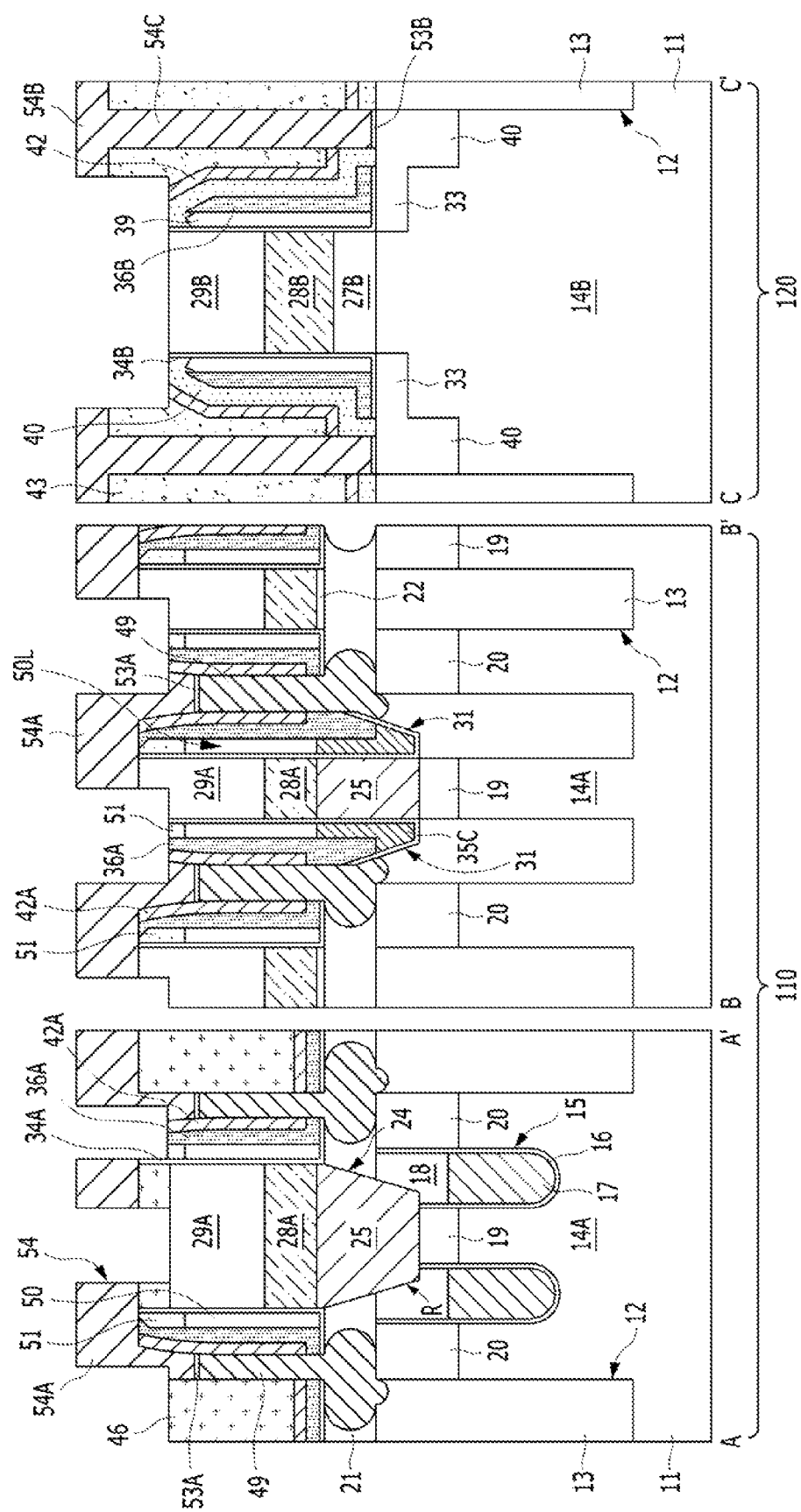
FIG. 5 is a cross-sectional view illustrating a semiconductor device in accordance with another embodiment.

FIG. 5 is cross sectional view illustrating semiconductor device in accordance with another embodiment. Referring to FIG. 5, a bit line air spacer may have a partial air gap structure. The partial air gap structure includes a line shape air gap 50L. The bit line air spacer does not have a plug type air gap. To form the partial air gap structure, cell sacrificial spacers 35A may not be completely removed. Instead, the cell sacrificial spacers 35A may partially remain in gaps 31. For example, filling spacers 35C may remain between a first plug 25 and second plugs 49.

The semiconductor device according to the above-described embodiments may be applied to a DRAM (dynamic random access memory), a SRAM (static random access memory), a flash memory, a FeRAM (ferroelectric random access memory), a MRAM (magnetic random access memory), a PRAM (phase change random access memory), etc.

As is apparent from the above descriptions, according to the embodiments, since air gaps are formed between a bit line contact plug and a storage node contact plug and between a bit line and the storage node contact plug, parasitic capacitance may be reduced.

Also, according to the embodiments, since gate air spacers are formed on the sidewalls of a planar gate electrode, the parasitic capacitance between the planar gate electrode and a metal contact plug may be reduced. Further, since a capping layer and a capping strengthening layer are formed on the gate air spacers, the gate air spacers may be stably protected from a subsequent process.

As a result, according to the embodiments, by simultaneously forming air gaps in a memory cell region and a peripheral circuit region, the operation speed of a semiconductor device may be improved.

What is claimed is:

1. A semiconductor device comprising:
   a substrate including a memory cell region and a peripheral circuit region;
   a buried word line formed in the substrate in the memory cell region;
   a bit line structure formed in the memory cell region and including a first plug and a bit line, wherein the first plug is electrically coupled to a first impurity region in the memory cell region, wherein the bit line is provided over the first plug;
   a planar gate structure formed over the substrate in the peripheral circuit region;
   a gate air spacer including a first air gap and positioned over a sidewall of the planar gate structure;
   a second plug electrically coupled to a second impurity region in the memory cell region and including a first portion and a second portion, wherein the first portion is provided over a sidewall of the first plug, wherein the second portion extends from the first portion and is provided over a sidewall of the bit line; and
   a bit line air spacer including a second air gap and positioned between the bit line structure and the second plug.

2. The semiconductor device according to claim 1, further comprising:
   a first capping layer which caps the first air gap; and
   a capping strengthening layer covering the first capping layer.

3. The semiconductor device according to claim 1, wherein the second air gap includes a line shape air gap and a plug type air gap,
   wherein the line shape air gap extends in parallel to the sidewall of the bit line, and
   wherein the plug type air gap extends from the line shape air gap to over the sidewall of the first plug.

4. The semiconductor device according to claim 3, further comprising:
   a second capping layer capping the line shape air gap.

5. The semiconductor device according to claim 1, further comprising:
   an ohmic contact layer over the second plug;
   a third plug over the ohmic contact layer; and
   a memory element over the third plug.

* * * * *